United States Patent
Logue et al.

(10) Patent No.: US 7,187,742 B1
(45) Date of Patent: Mar. 6, 2007

(54) SYNCHRONIZED MULTI-OUTPUT DIGITAL CLOCK MANAGER

(75) Inventors: John D. Logue, Placerville, CA (US); Andrew K. Percey, San Jose, CA (US); F. Erich Goetting, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 715 days.

(21) Appl. No.: 09/684,529

(22) Filed: Oct. 6, 2000

(51) Int. Cl.
*H03D 3/24* (2006.01)

(52) U.S. Cl. ............... 375/376; 375/373; 375/371; 375/375; 370/517; 331/78; 331/16

(58) Field of Classification Search ........... 375/376, 375/371, 222, 354, 375, 373; 327/149; 711/167, 711/176; 370/517, 516, 503; 331/78, 16
See application file for complete search history.

(56) References Cited

U.S. PATENT DOCUMENTS

| | | | |
|---|---|---|---|
| 5,068,628 A | | 11/1991 | Ghoshal |
| 5,511,100 A | * | 4/1996 | Lundberg et al. ........... 375/376 |
| 5,631,920 A | | 5/1997 | Hardin |
| 5,790,612 A | | 8/1998 | Chengson et al. |
| 5,805,003 A | | 9/1998 | Hsu |
| 5,990,714 A | * | 11/1999 | Takahashi .................... 327/149 |
| 6,014,063 A | | 1/2000 | Liu et al. |
| 6,101,197 A | * | 8/2000 | Keeth et al. ................ 370/517 |
| 6,125,157 A | | 9/2000 | Donnelly et al. |
| 6,151,356 A | | 11/2000 | Spagnoletti et al. |
| 6,184,753 B1 | | 2/2001 | Ishimi et al. |
| 6,188,288 B1 | * | 2/2001 | Ragan et al. ................. 331/16 |
| 6,194,930 B1 | | 2/2001 | Matsuzaki et al. |
| 6,289,068 B1 | * | 9/2001 | Hassoun et al. ............. 375/376 |
| 6,445,234 B1 | * | 9/2002 | Yoon et al. .................. 327/161 |
| 6,487,648 B1 | * | 11/2002 | Hassoun ...................... 711/167 |
| 6,501,309 B1 | | 12/2002 | Tomita |
| 6,539,072 B1 | * | 3/2003 | Donnelly et al. ........... 375/371 |
| 6,625,242 B1 | | 9/2003 | Yoo et al. |

(Continued)

FOREIGN PATENT DOCUMENTS

WO     WO 99/67882 A1     12/1999

OTHER PUBLICATIONS

Alex Waizman; A Delay Lin Loop for Frequency Synthesis of De-Skewed Clock; Solid-State Circuit Conference, 1994 IEEE; p. 298-299.*
Hiroki Sutoh et al., A Clock Distribution Technique with an Automatic Skew Compensation Circuit, IEICE Transactions on Electronics, Institute of Electronics Information and Commercial Engineering, vol. E81-C., No. 2, Feb. 1, 1998, pp., 277-283, Tokyo, JP.
U.S. Appl. No. 09/684,528, filed Oct. 6, 2000, Percey et al.
U.S. Appl. No. 10/837,059, filed Apr. 30, 2004, Logue et al.

*Primary Examiner*—Chen M. Fan
*Assistant Examiner*—Eva Zheng
(74) *Attorney, Agent, or Firm*—E. Eric Hoffman; John King

(57) ABSTRACT

A digital clock manager is provided. The digital clock manager generates an output clock signal that causes a skewed clock signal to be synchronized with a reference clock signal. Furthermore, the digital clock manager generates a frequency adjusted clock signal that is synchronized with the output clock signal during concurrence periods. The digital clock manager includes a delay lock loop and a digital frequency synthesizer. The delay lock loop generates a synchronizing clock signal that is provided to the digital frequency synthesizer. The output clock signal lags the synchronizing clock signal by a DLL output delay. Similarly, the frequency adjusted clock signal lags the synchronizing clock signal by a DFS output delay. By matching the DLL output delay to the DFS output delay, the digital clock manager synchronizes the output clock signal and the frequency adjusted clock signal.

17 Claims, 24 Drawing Sheets

U.S. PATENT DOCUMENTS 6,633,288 B2 * 10/2003 Agarwal et al. ............ 345/213
6,775,342 B1    8/2004 Young et al.

2002/0029355 A1 * 3/2002 Sakamoto et al. .......... 713/503

* cited by examiner

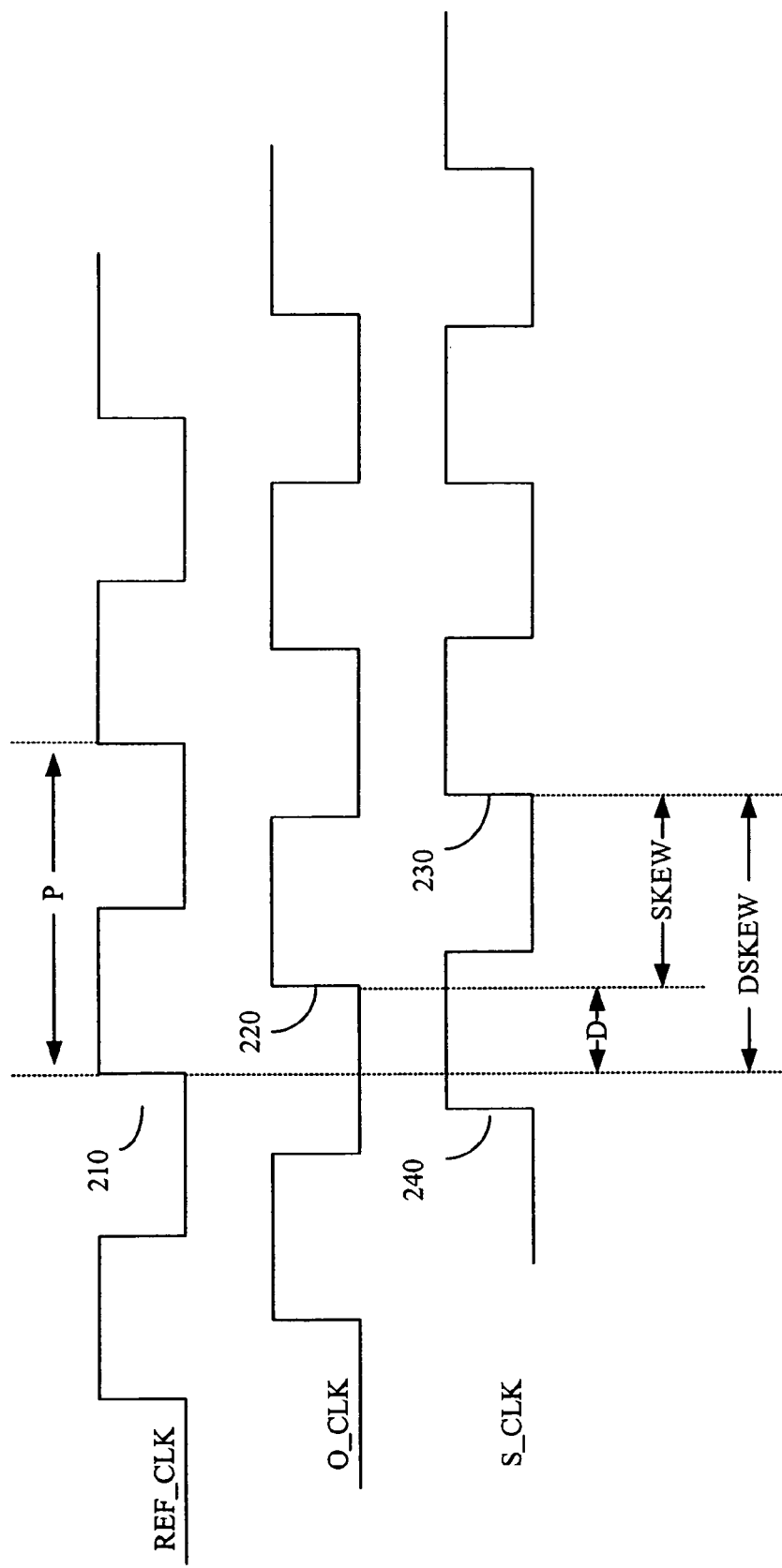

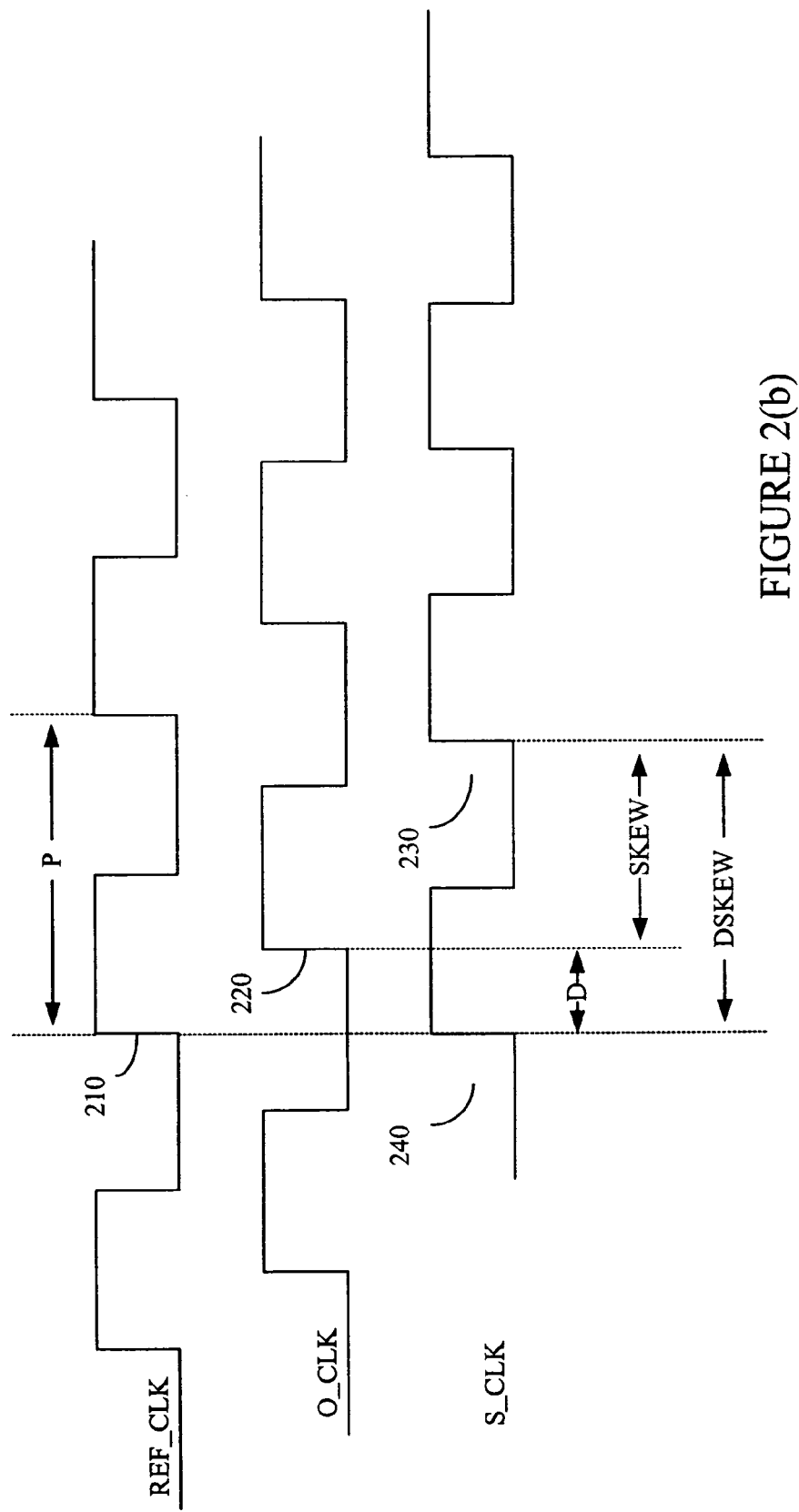

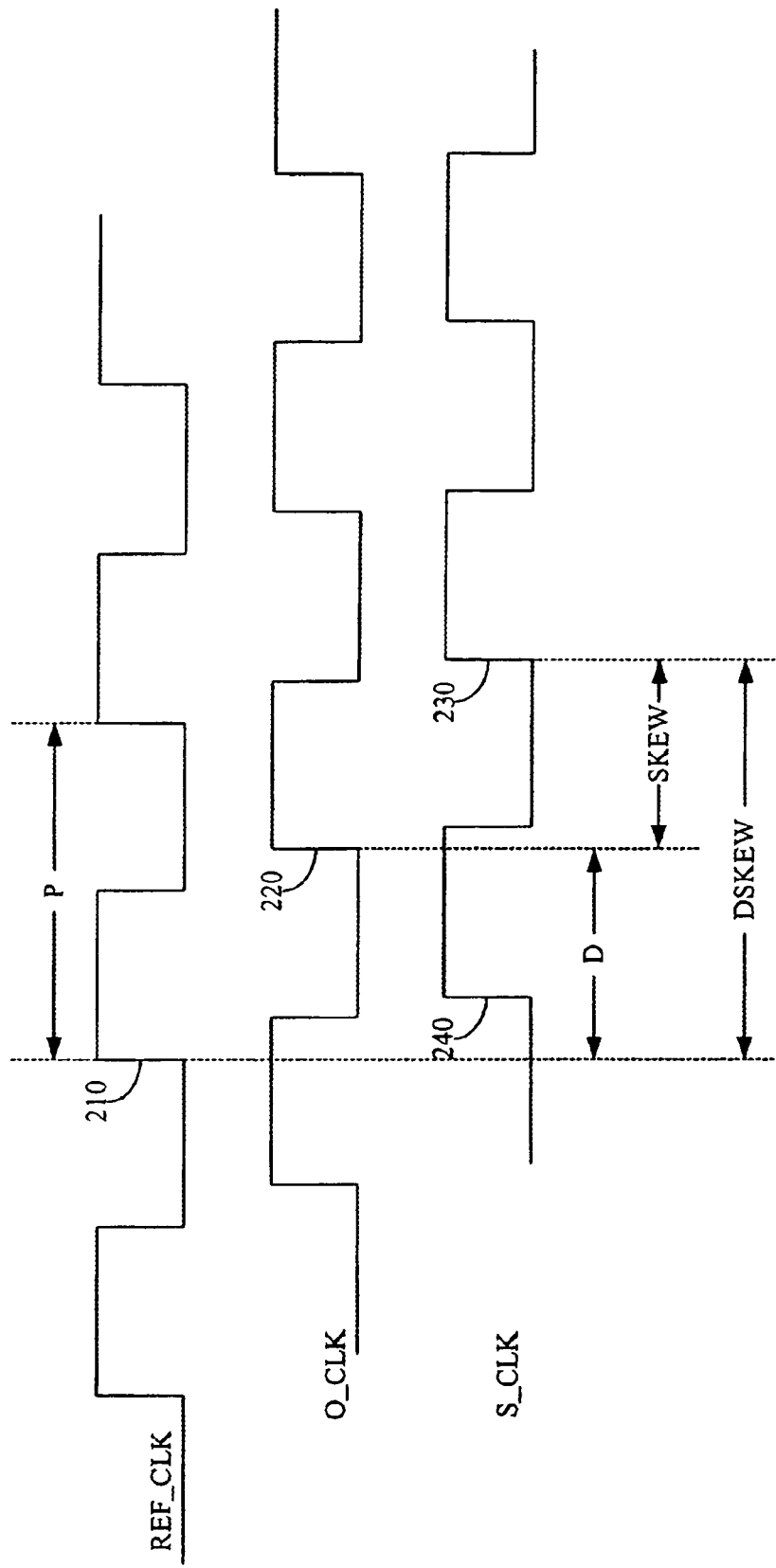

SYNCHRONIZED MULTI-OUTPUT DIGITAL CLOCK MANAGER

FIELD OF THE INVENTION

The present invention relates to digital clocking circuits for digital electronics. More specifically, the present invention relates to digital clock managers capable of generating multiple phase-locked output clock signals of different frequencies.

BACKGROUND OF THE INVENTION

Synchronous digital systems, including board level systems and chip level systems, rely on one or more clock signals to synchronize elements across the system. Typically, one or more clock signals are distributed across the system on one or more clock lines. However, due to various problems such as clock buffer delays, high capacitance of heavily loaded clock lines, and propagation delays, the edges of a clock signal in different parts of the system may not be synchronized. The time difference between a rising (or falling) edge in one part of the system with the corresponding rising (or falling) edge in another part of the system is referred to as "clock skew".

Clock skew can cause digital systems to malfunction. For example, it is common for circuits in digital systems to have a first flip-flop output driving a second flip-flop input. With a synchronized clock signal on the clock input terminal of both flip-flops, the data in the first flip-flop is successfully clocked into the second flip-flop. However, if the active edge on the second flip flop is delayed by clock skew, the second flip-flop might not capture the data from the first flip-flop before the first flip-flop changes state.

Delay lock loops are used in digital systems to minimize clock skew. Delay lock loops typically use delay elements to synchronize the active edges of a reference clock signal in one part of the system with a feedback clock signal from a second part of the system. FIG. 1 shows a block diagram of a conventional delay lock loop 100 coupled to logic circuits 190. Delay lock loop 100, which comprises a delay line 110 and a phase detector 120, receives a reference clock signal REF_CLK and drives an output clock signal O_CLK.

Delay line 110 delays reference clock signal REF_CLK by a variable propagation delay D before supplying output clock signal O_CLK. Thus, each clock edge of output clock signal O_CLK lags a corresponding clock edge of reference clock signal REF_CLK by propagation delay D (see FIG. 2(a)). Phase detector 120 controls delay line 110, as described below. Delay line 110 is capable of producing a minimum propagation delay D_MIN and a maximum propagation delay D_MAX.

Before output clock signal O_CLK reaches logic circuits 190, output clock signal O_CLK is skewed by clock skew 180. Clock skew 180 can be caused by delays in various clock buffers (not shown) or propagation delays on the clock signal line carrying output clock signal O_CLK (e.g., due to heavy loading on the clock signal line). To distinguish output clock signal O_CLK from the skewed version of output clock signal O_CLK, the skewed version is referred to as skewed clock signal S_CLK. Skewed clock signal S_CLK drives the clock input terminals (not shown) of the clocked circuits within logic circuits 190. Skewed clock signal S_CLK is also routed back to delay lock loop 100 on a feedback path 170. Typically, feedback path 170 is dedicated specifically to routing skewed clock signal S_CLK to delay lock loop 110. Therefore, any propagation delay on feedback path 170 is minimal and causes only negligible skewing.

FIG. 2(a) provides a timing diagram of reference clock signal REF_CLK, output clock signal O_CLK, and skewed clock signal S_CLK. All three clock signals have the same frequency F_REF (not shown) and period P_REF, and all are active-high (i.e., the rising edge is the active edge). Since output clock signal O_CLK is delayed by propagation delay D, a clock edge 220 of output clock signal O_CLK lags corresponding clock edge 210 of reference clock signal REF_CLK by propagation delay D. Similarly, a clock edge 230 of skewed clock signal S_CLK lags corresponding clock edge 220 of output clock signal O_CLK by a propagation delay SKEW, which is the propagation delay caused by clock skew 180 (FIG. 1). Therefore, clock edge 230 of skewed clock signal S_CLK lags clock edge 210 of reference clock signal REF_CLK by a propagation delay DSKEW, which is equal to propagation delay D plus propagation delay SKEW.

Delay lock loop 100 controls propagation delay D by controlling delay line 110. However, delay line 110 cannot create negative delay; therefore, clock edge 230 cannot be synchronized to clock edge 210. Fortunately, clock signals are periodic signals. Therefore, delay lock loop 100 can synchronize reference clock signal REF_CLK and skewed clock signal S_CLK by further delaying output clock signal O_CLK such that clock edge 240 of skewed clock signal S_CLK is synchronized with clock edge 210 of reference clock signal REF_CLK. As shown in FIG. 2(b), propagation delay D is adjusted so that propagation delay DSKEW is equal to period P. Specifically, delay line 110 is tuned so that propagation delay D is increased until propagation delay D equals period P minus propagation delay SKEW. Although propagation delay DSKEW could be increased to any multiple of period P to achieve synchronization, most delay lock loops do not include a delay line capable of creating such a large propagation delay.

Phase detector 120 (FIG. 1) controls delay line 110 to regulate propagation delay D. The actual control mechanism for delay lock loop 100 can differ. For example, in one version of delay lock loop 100, delay line 110 starts with a propagation delay D equal to minimum propagation delay D_MIN, after power-on or reset. Phase detector 110 then increases propagation delay D until reference clock signal REF_CLK is synchronized with skewed clock signal S_CLK. In another system, delay lock loop 100 starts with a propagation delay D equal to the average of minimum propagation delay D_MIN and maximum propagation delay D_MAX, after power-on or reset. Phase detector 120 then determines whether to increase or decrease (or neither) propagation delay D to synchronize reference clock signal REF_CLK with skewed clock signal S_CLK. For example, phase detector 120 would increase propagation delay D for the clock signals depicted in FIG. 2(a). However, phase detector 120 would decrease propagation delay D for the clock signals depicted in FIG. 2(c).

In FIG. 2(c), skewed clock signal S_CLK is said to "lag" reference clock signal REF_CLK, because the time between a rising edge of reference clock signal REF_CLK and the next rising edge of skewed clock signal S_CLK is less than the time between a rising edge of skewed clock signal S_CLK and the next rising edge of reference clock signal REF_CLK. However, in FIG. 2(a), reference clock signal REF_CLK is said to "lag" skewed clock signal S_CLK, because the time between a rising edge of skewed clock signal S_CLK and the next rising edge of reference clock signal REF_CLK is less than the time between a rising clock edge of reference clock signal REF_CLK and the next rising clock edge of skewed clock signal S_CLK. Alternatively, in FIG. 2(a) skewed clock signal S_CLK could be said to "lead" reference clock signal REF_CLK.

After synchronizing reference clock signal REF_CLK and skewed clock signal S_CLK, delay lock loop 100 monitors reference clock signal REF_CLK and skewed clock signal S_CLK and adjusts propagation delay D to maintain synchronization. For example, if propagation delay SKEW increases, perhaps caused by an increase in temperature, delay lock loop 100 must decrease propagation delay D to compensate. Conversely, if propagation delay SKEW decreases, perhaps caused by a decrease in temperature, delay lock loop 100 must increase propagation delay D to compensate. The time in which delay lock loop 100 is attempting to first synchronize reference clock signal REF_CLK and skewed clock signal S_CLK, is referred to as lock acquisition. The time in which delay lock loop 100 is attempting to maintain synchronization is referred to as lock maintenance. The value of propagation delay D at the end of lock acquisition, i.e. when synchronization is initially established, is referred to as initial propagation delay ID.

Further complications with clock skew exists in complex digital systems, such as microprocessors and FPGAs, that have multiple clock signals at different frequencies. For example, in some microprocessors, internal circuits are clocked by a first clock signal at a first clock frequency while input/output (I/O) circuits are clocked by a second clock signal at a second clock frequency. Typically, the second clock frequency is slower than the first clock frequency.

Most systems use one clock generating circuit to generate a first clock signal and a specialized circuit to derive other clock signals from the first clock signal. For example, clock dividers are used to generate one or more clock signals of lower clock frequencies from a reference clock signal. Typically, clock dividers divide the frequency of the reference clock signal by an integer value. Conversely, clock multipliers are used to generate one or more clock signals of higher clock frequencies from the reference clock signal. Combining clock multipliers with clock dividers provide clocking circuits which can generate one or more clock signals having frequencies that are fractional values of the frequency of the reference clock signal.

Thus, a clocking circuit is typically coupled to reference clock signal REF_CLK to generate a frequency adjusted clock signal FREQ_CLK. However, the clocking circuits add additional skew due to propagation delay and gate switching times. Consequently, frequency adjusted clock signal FREQ_CLK may be skewed compared to both reference clock signal REF_CLK and output clock signal O_CLK. Hence, there is a need for a method and circuits that can compensate for skew in both an output clock signal and a frequency adjusted clock signal.

SUMMARY

The present invention provides a digital clock manager that generates a deskewed output clock signal as well as a deskewed frequency adjusted clock signal. Specifically, the output clock signal causes a skewed clock signal to be synchronized with a reference clock signal. The frequency adjusted clock signal is synchronized with the output clock signal during concurrences. Generally the frequency adjusted clock signal is driven to a selected clock frequency which is equal to the clock frequency of the output clock signal multiplied by a multiplier M and divided by a divider D, where M and D are natural numbers. When the frequency of the frequency adjusted clock signal is equal to the selected frequency and the frequency adjusted clock signal is in phase with the output clock signal, every Mth rising edge of the frequency adjusted clock signal aligns with a rising edge of the output clock signal. The alignments are commonly referred to as concurrences.

One embodiment of the digital clock manager includes a delay lock loop (DLL) and a digital frequency synthesizer (DFS). The delay lock loop is configured to generate an output clock signal that synchronizes a skewed clock signal with a reference clock signal. The delay lock loop also generates a synchronizing clock signal, which is provided to the digital frequency synthesizer. The delay lock loop has a DLL output circuit that generates the output clock signal, which lags the synchronizing clock signal by a DLL output delay. In the digital frequency synthesizer, a DFS output circuit generates a frequency adjusted clock signal in which an active edge of the frequency adjusted clock signal lags an active edge of the synchronizing clock signal by a DFS output delay during a concurrence period. By matching the DLL output delay with the DFS output delay, the output clock signal and the frequency adjusted clock signals are synchronized.

The present invention will be more fully understood in view of the following description and drawings.

BRIEF DESCRIPTION OF THE DRAWINGS

FIGS. 2(a), 2(b) and 2(c) are timing diagrams for the system of FIG. 1.

DETAILED DESCRIPTION

Figure 3:
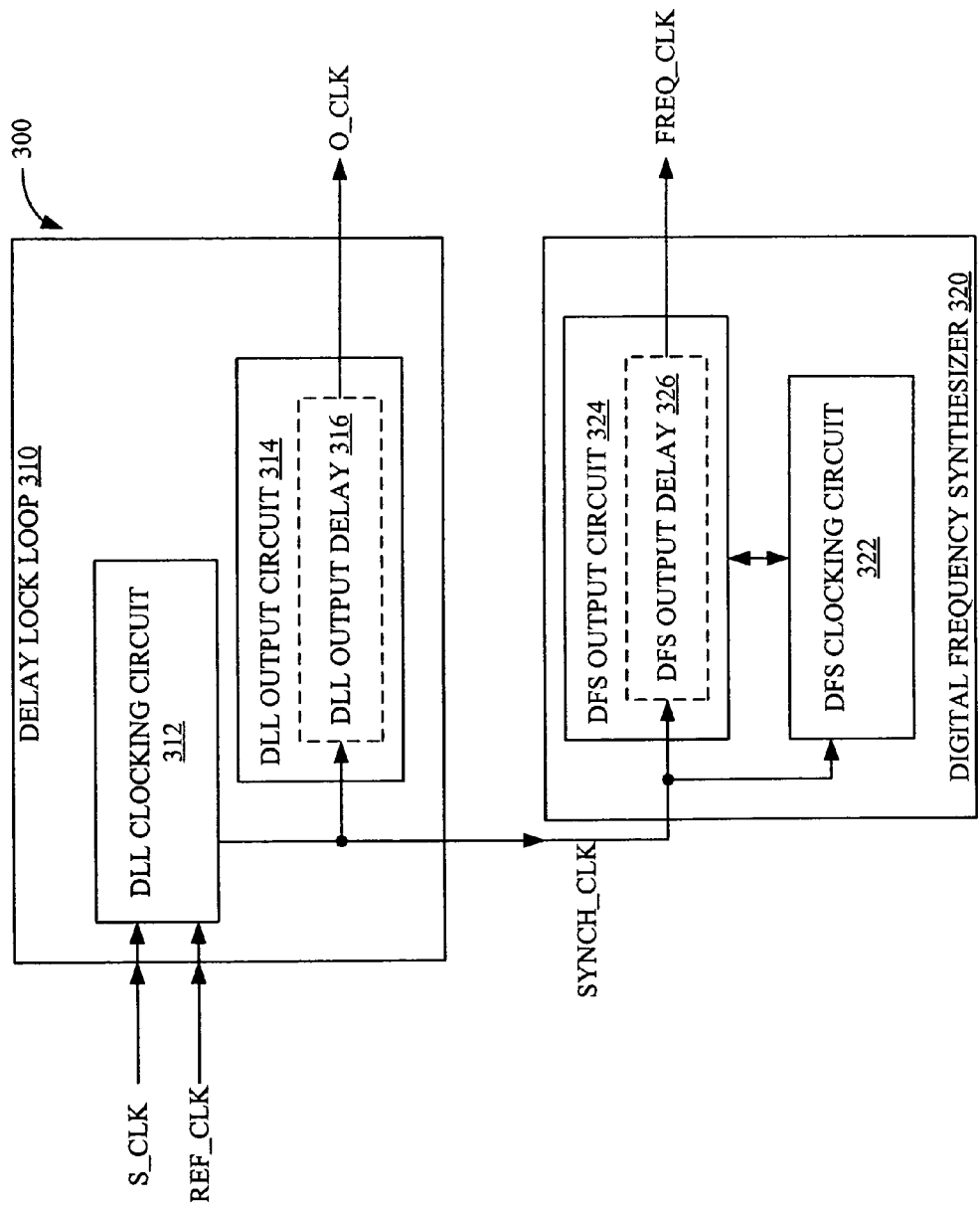
FIG. 3 is a block diagram of a digital clock manager in accordance with one embodiment of the present invention.

FIG. 3 is a block diagram of a digital clock manager 300 in accordance with one embodiment of the present invention. Digital clock manager 300, which receives a reference clocks signal REF_CLK and a skewed clock signal S_CLK, generates an output clock signal O_CLK, which causes skewed clock signal S_CLK to be synchronized with reference clock signal REF_CLK, and a frequency adjusted clock signal FREQ_CLK which is phase locked with output clock signal O_CLK during concurrences. Generally, frequency adjusted clock signal FREQ_CLK has an adjusted frequency F_ADJ which is equal to the frequency of output clock signal O_CLK multiplied by a multiplier M and divided by a divider D. If frequency adjusted clock signal FREQ_CLK is in phase with clock signal O_CLK, every Mth rising edge of frequency adjusted clock signal FREQ_CLK aligns with a rising edge of output clock signal O_CLK. The alignments are commonly referred to as concurrences. Reference clock signal REF_CLK and output clock signal O_CLK have the same frequency. For clarity, reference frequency F_REF is used to denote the frequency of both reference clock signal REF_CLK and output clock signal O_CLK.

The embodiment of FIG. 3 includes a delay lock loop 310 and a digital frequency synthesizer 320. While specific embodiments of delay lock loop 310 and digital frequency synthesizer 320 are described below, the principles of the present invention can be adapted for use with almost any delay lock loop and any digital frequency synthesizer. Thus, the description with respect to digital clock manager 300 describes delay lock loop 310 and digital frequency synthesizer 320 is in general terms. One skilled in the art can adapt the principles of the present invention to create a digital clock manager with a variety of delay lock loops and digital frequency synthesizers.

Delay Lock Loop 310 includes DLL clocking circuit 312 and DLL output circuit 314. DLL clocking circuit 312 generates a synchronizing clock signal SYNCH_CLK, which is provided to DLL output circuit 314 and DFS output circuit 324 of digital frequency synthesizer 320. Generally, synchronizing clock signal SYNCH_CLK has a frequency equal to frequency F_REF of reference clock signal REF_CLK and output clock signal O_CLK. DLL output circuit 314 drives output clock signal O_CLK. DLL output circuit 314 introduces a DLL output delay 316 between synchronizing clock signal SYNCH_CLK and output clock circuit O_CLK. Specifically, output clock signal O_CLK lags synchronizing clock signal SYNCH_CLK by DLL output delay 316. DLL clocking circuit 312 and DLL output circuit 314 together synchronizes skewed clock signal S_CLK with reference clock signal REF_CLK. A specific embodiment of delay lock loop 310 used in one embodiment of the present invention is described below.

Digital frequency synthesizer 320 receives synchronized clock signal SYNCH_CLK and generates frequency adjusted clock signal FREQ_CLK having adjusted frequency F_ADJ, which is equal to the frequency of output clock signal O_CLK multiplied by a multiplier M and divided by a divider D. As shown in FIG. 3, digital frequency synthesizer 320 includes a DFS clocking circuit 322 and a DFS output circuit 324. DFS output circuit 324 drives frequency adjusted clock signal FREQ_CLK and introduces a DFS output delay 326 between frequency adjusted clock signal FREQ_CLK and synchronizing clock signal SYNCH_CLK. Specifically, during concurrence periods of synchronizing clock signal SYNCH_CLK with frequency adjusted clock signal FREQ_CLK, an active edge of frequency adjusted clock signal FREQ_CLK lags an active edge of synchronizing clock signal SYNCH_CLK by DFS output delay 326. DFS clocking circuit 322 and DFS output circuit 324 combine to perform the frequency adjustments necessary to generate frequency adjusted clock signal FREQ_CLK.

Because output clock signal O_CLK lags synchronizing clock signal SYNCH_CLK by DLL output delay 316 and frequency adjusted clock signal FREQ_CLK lags synchronizing clock signal SYNCH_CLK by DFS output delay 326, frequency adjusted clock signal FREQ_CLK can be synchronized with output clock signal O_CLK by matching DLL output delay 316 with DFS output delay 326. Thus, in accordance with some embodiments of the invention, the components of DFS output circuit 324 and DLL output circuit 314 are chosen to match DLL output delay 316 with DFS output delay 326. For example, in some embodiments of the present invention, DLL output circuit 314 and DFS output circuit 324 comprise the identical components. Furthermore, in some embodiments of the present invention, the layout and routing for DLL output circuit 314 closely match the layout and routing for DFS output circuit 324. By matching components, layout, and routing, these embodiments of the present invention can achieve near-perfect matching between DLL output delay 316 and DFS output delay 326.

Figure 4:
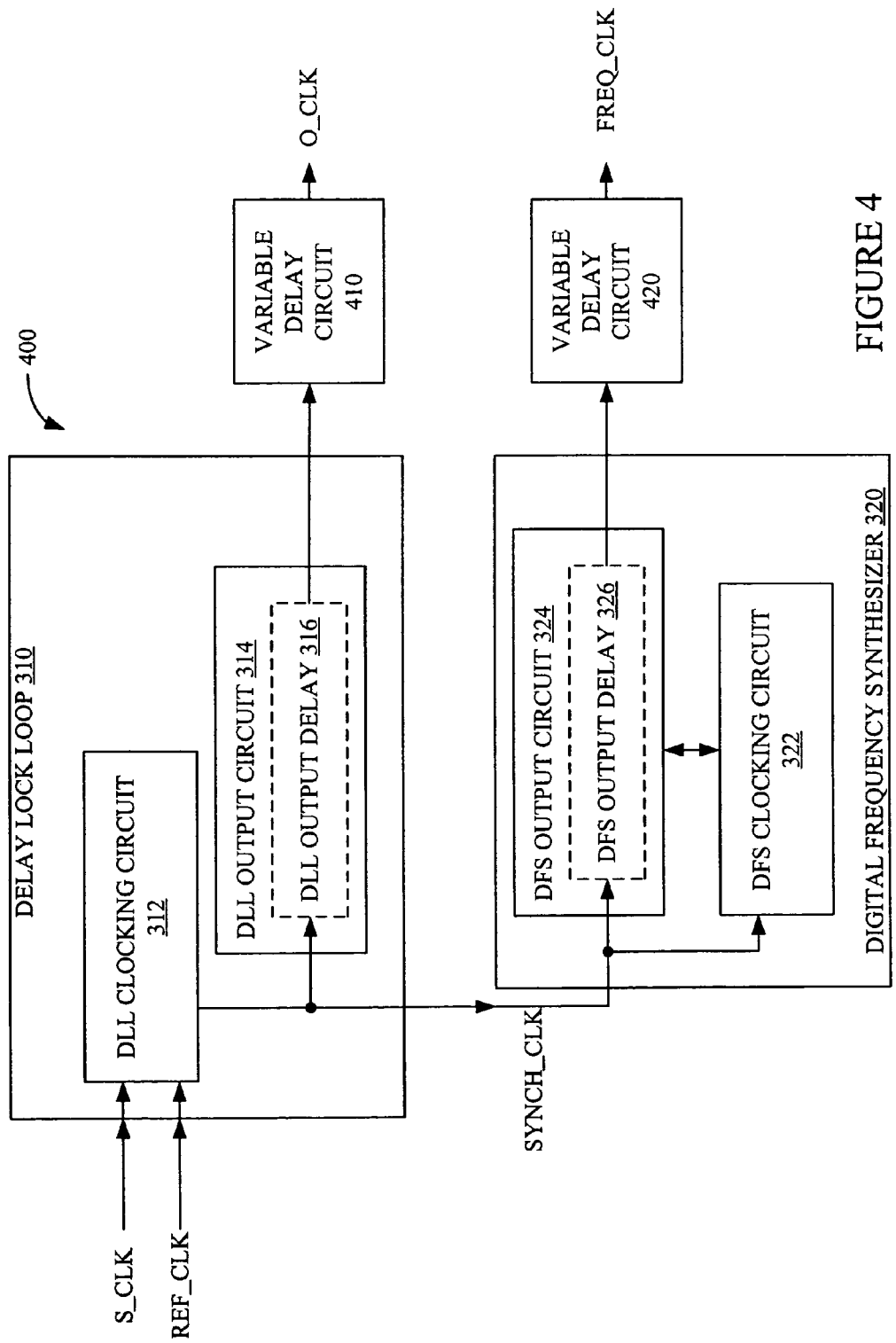
FIG. 4 is a block diagram of a digital clock manager in accordance with one embodiment of the present invention.

However, some embodiments of the present invention can not achieve suitable matching of DFS output delay 326 and DLL output delay 316. For these embodiments, additional delay circuitry can be used to synchronize output clock signal O_CLK and frequency adjusted clock signal FREQ_CLK. FIG. 4 is a block diagram of a digital clock manager 400 using variable delay circuits 410 and 420 in accordance with one embodiment of the present invention. Because, digital clock manager 400 is similar to digital clock manager 300, similar reference numerals are used for similar elements. In addition, descriptions of the repeated elements are omitted for brevity. Variable delay circuit 410 is coupled to DLL output circuit 314 and generates output clock signal O_CLK. Similarly, variable delay circuit 420 is coupled to DFS output circuit 324 and generates frequency adjusted clock signal FREQ_CLK.

In digital clock manager 400, DLL output delay 316 and DFS output delay 326 can not be adequately matched However, variable delay circuit 410, which provides additional delay to DLL output delay 316, and variable delay circuit 420, which provides additional delay to DFS output delay 326 can be used to synchronize output clock signal O_CLK with frequency adjusted clock signal FREQ_CLK. Specifically, DLL output delay 316 plus the delay provided by variable delay circuit 410 should be matched with DFS output delay 326 plus the delay provided by variable delay circuit 420. In many embodiments of the present invention, delay match can be achieved using only one of variable delay circuits 410 or 420. Therefore, these embodiments would not need to include both variable delay circuit 410 and variable delay circuit 420.

Figure 5:
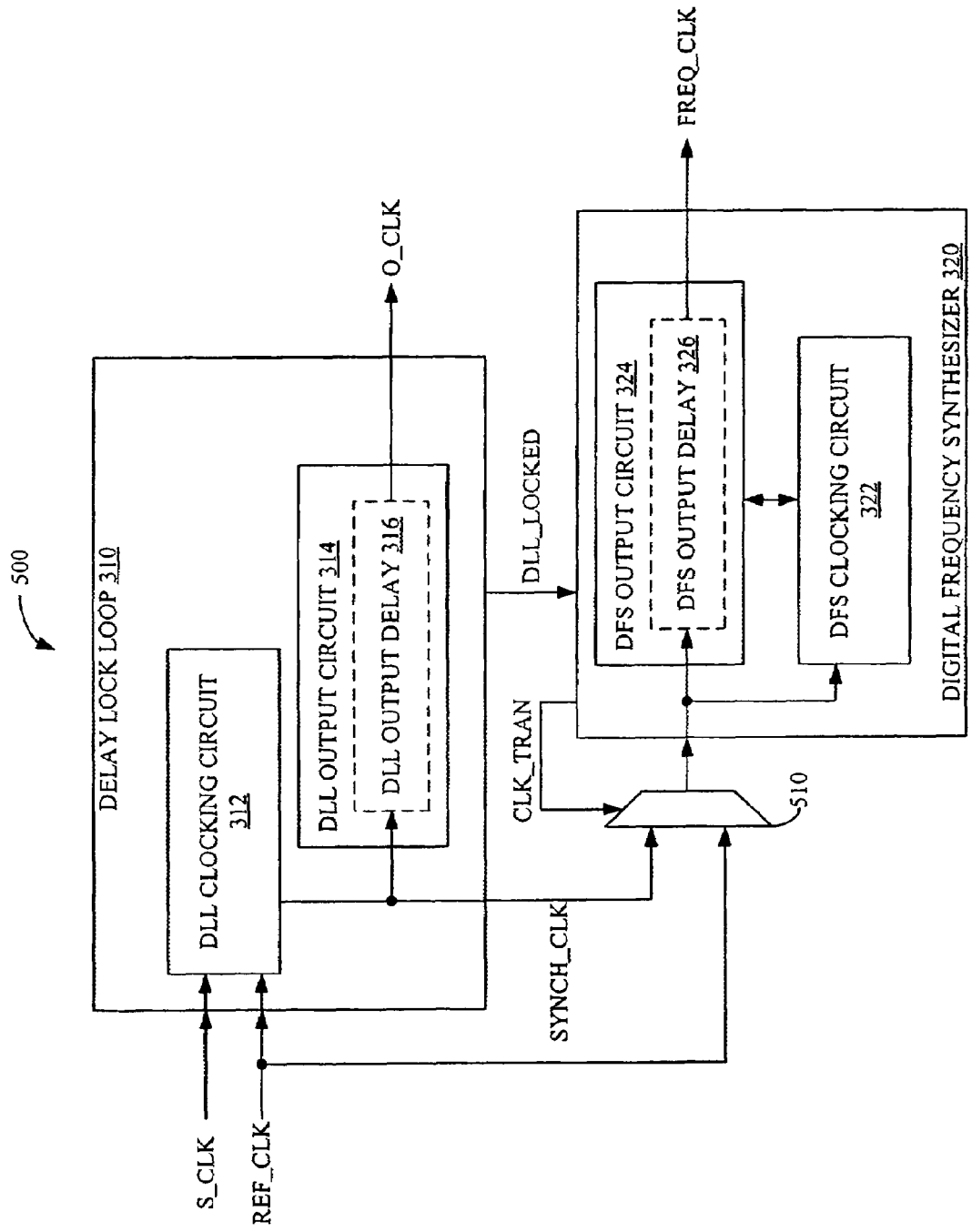
FIG. 5 is a block diagram of a digital clock manager in accordance with one embodiment of the present invention.

FIG. 5 is a block diagram of a digital clock manager 500 in accordance with one embodiment of the present invention. Because, digital clock manager 500 is similar to digital clock manager 300, similar reference numerals are used for similar elements. In addition, descriptions of the repeated elements are omitted for brevity. Digital clock manager 500 reduces the time required to generate frequency adjusted clock signal FREQ_CLK as compared to digital clock manager 300. As is well known in the art, delay lock loops operate in a lock acquisition mode prior to generating a stable output clock signal. Similarly, digital frequency synthesizers operate in various frequency search phases prior to generating a stable frequency adjusted clock signal. In digital clock manager 300, delay lock loop 310 must first undergo a lock acquisition mode to generate synchronizing clock signal SYNCH_CLK. Then digital frequency synthesizer must undergo various frequency search phases prior to generating frequency adjusted clock signal FREQ_CLK.

However, in digital clock manager 500, lock acquisition by delay lock loop 310 and frequency search phases by digital frequency synthesizer 320 can occur simultaneously to reduce the time necessary to generate output clock signal O_CLK and frequency adjusted clock signal FREQ_CLK. Specifically, digital clock manager 500 includes a multiplexer 510, having a first input terminal coupled to receive reference clock signal REF_CLK, a second input terminal coupled to receive synchronizing clock signal SYNCH_CLK and an output terminal coupled to digital frequency synthesizer 320. Multiplexer 510 is controlled by a clock transition control signal CLK_TRAN from digital frequency synthesizer 320. Clock transition control signal CLK_TRAN is driven to an inactive state while delay locked loop is performing lock acquisition or digital frequency synthesizer 320 is not ready for a clock transition. If clock transition control signal is in the inactive state, multiplexer 510 couples reference clock signal REF_CLK to digital frequency synthesizer 320.

Because reference clock signal REF_CLK is already at reference frequency F_REF, digital frequency synthesizer 320 can perform the required frequency search phases using reference clock signal REF_CLK. After delay lock loop 310 finishes lock acquisition, a control signal DLL_LOCKED is driven to an active state (e.g., logic high) signaling digital frequency synthesizer 320 that delay lock loop 310 has completed lock acquisition. Then, when digital frequency synthesizer is ready for transitioning to synchronizing clock signal SYNCH_CLK, clock transition control signal CLK_TRAN is driven to the active state, which causes synchronizing clock signal SYNCH_CLK to be provided to digital frequency synthesizer 320. For example, in some embodiments of the present invention, digital frequency synthesizer 320 completes a frequency search phase prior to driving control signal CLK_TRAN to select synchronizing clock signal SYNCH_CLK. Furthermore, in some embodiments of the present invention, digital frequency synthesizer 320 is halted prior to switching from reference clock signal REF_CLK to synchronizing clock signal SYNCH_CLK and then restarted. Thus, digital clock manager 500 reduces the time required to generate frequency adjusted clock signal FREQ_CLK by allowing acquisition lock by delay lock loop 310 and frequency searches by digital frequency synthesizer 320 to operate simultaneously.

Figure 1:
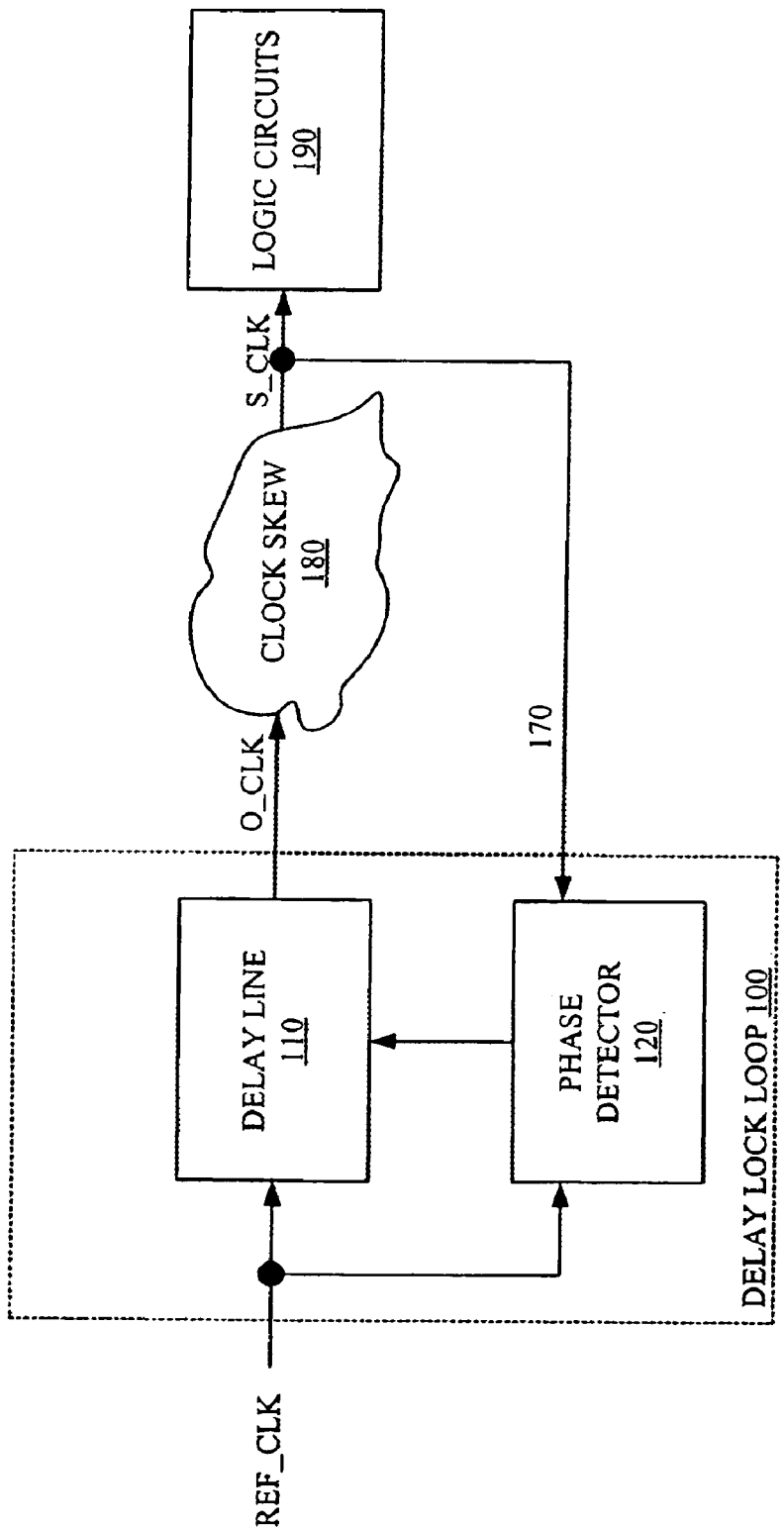
FIG. 1 is a block diagram of a system using a conventional delay lock loop.
Figure 6:
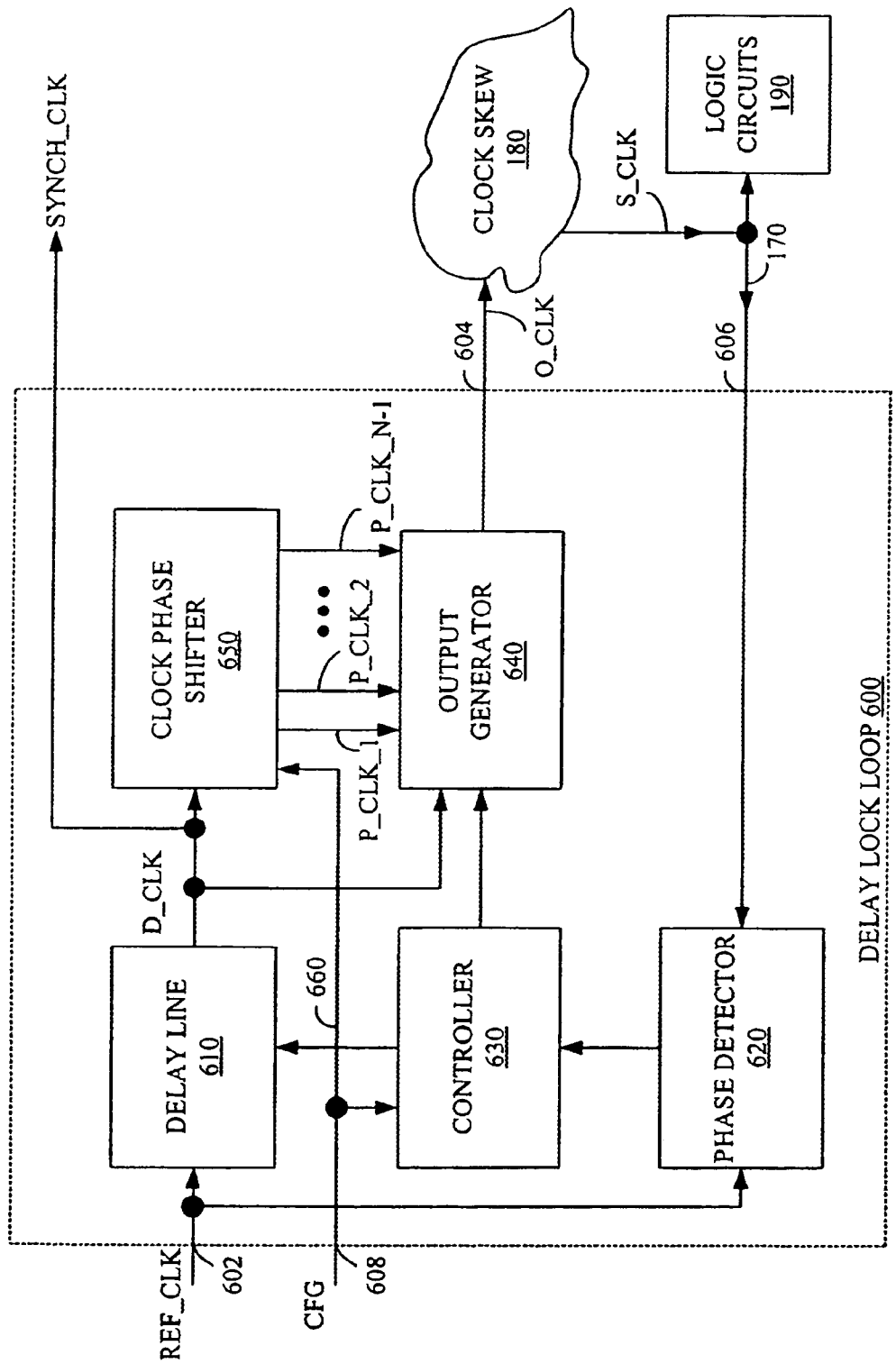
FIG. 6 is a block diagram of a system using an embodiment of a delay lock loop in accordance with the present invention.

FIG. 6 is a block diagram of a system using a delay lock loop 600 in accordance with one embodiment of the present invention. Delay lock loop 600 comprises a delay line 610, a clock phase shifter 650, a controller 630, an output generator 640, and a phase detector 620. Delay lock loop 600 receives reference clock signal REF_CLK on a reference input terminal 602 and generates output clock signal O_CLK on output terminal 604. As explained above with respect to FIG. 1, output clock signal O_CLK is skewed by clock skew 180 into skewed clock signal S_CLK, which clocks logic circuits 190. Skewed clock signal S_CLK is also fed back to a feedback terminal 606 of delay lock loop 600 on feedback path 170.

Within delay lock loop 600, reference clock signal REF_CLK is delayed by delay line 610 to generate delayed clock signal D_CLK. Delayed clock signal D_CLK is delayed from clock signal REF_CLK by a propagation delay D in delay line 610. One embodiment of delay lock loop 600 uses an adjustable delay line described in U.S. Pat. No. 6,400,735 B1 issued on Jun. 4, 2002, entitled "Glitchless Delay Line Using Gray Code Multiplexer" by Andrew K. Percey, which is incorporated herein by reference. However, other adjustable delay lines can also be used with delay lock loop 600. Delayed clock signal D_CLK is provided to an input terminal of a clock phase shifter 650 and to an input terminal of an output generator 640. Delayed clock signal D_CLK is also provided to digital frequency synthesizer 320 as synchronizing clock signal SYNCH_CLK.

Clock phase shifter 650 generates one or more phase-shifted clock signals P_CLK_1 to P_CLK N–1, where N is a positive integer. In one embodiment, phase-shifted clock signal P_CLK_1 is phase-shifted by 360/N degrees from delayed clock signal D_CLK'. Phase-shifted clock signal P_CLK_2 is phase-shifted by 2*(360/N) degrees. Phase-shifted clock signal P_CLK_N–1 is phase-shifted by (N–1)*(360/N) degrees. Thus, in general a phase-shifted clock signal P_CLK_Z is phase-shifted by Z*(360/N), where Z is an integer between 1 and (N–1), inclusive. Delayed clock signal D_CLK can be considered a phase-shifted clock signal P_CLK_0 since delayed clock signal D_CLK has a 0 degree phase shift from itself. Further, in some embodiments of delay lock loop 600, clock phase shifter 650 generates a phase-shifted signal P_CLK_N that has the same phase and frequency as delayed clock signal D_CLK.

Thus, in an embodiment of clock phase shifter 650 where N is equal to four, phase-shifted clock signal P_CLK_1 is phase-shifted 90 degrees from delayed clock signal D_CLK. It logically follows that phase-shifted clock signal P_CLK_2 is phase-shifted by 180 degrees from delayed clock signal D_CLK and phase-shifted clock signal P_CLK_3 is phase-shifted by 270 degrees from delayed clock signal D_CLK_However, the principles of the present invention are also suitable for other embodiments of clock phase shifter 650 using other patterns of phase shifting between the phase-shifted clock signals.

Phase shifting is a concept in the frequency domain of a clock signal. The equivalent of phase shifting in the time domain is delaying the clock signal. Specifically, if a first clock signal is phase-shifted from a second clock signal by X degrees, the first clock signal is delayed by X*(P/360), where P is the period of the first and second clock signals. Thus, if phase-shifted clock signal P_CLK_1 is phase-shifted 90 degrees from delayed clock signal D_CLK, phase-shifted clock signal P_CLK_1 is delayed by one-fourth of the period of delayed clock signal D_CLK. To distinguish delays caused by phase shifting from other propagation delays, delays caused by phase shifting are referred to as phase-shifted delays P_D_Z. Since a phase-shifted clock signal P_CLK_Z is phase-shifted by Z*(360/N) degrees, phase-shifted clock signal P_CLK_Z has a phase-shifted delay P_D_Z equal to Z*(P/N), where Z is an integer between 1 and (N−1), inclusive.

Figure 7:
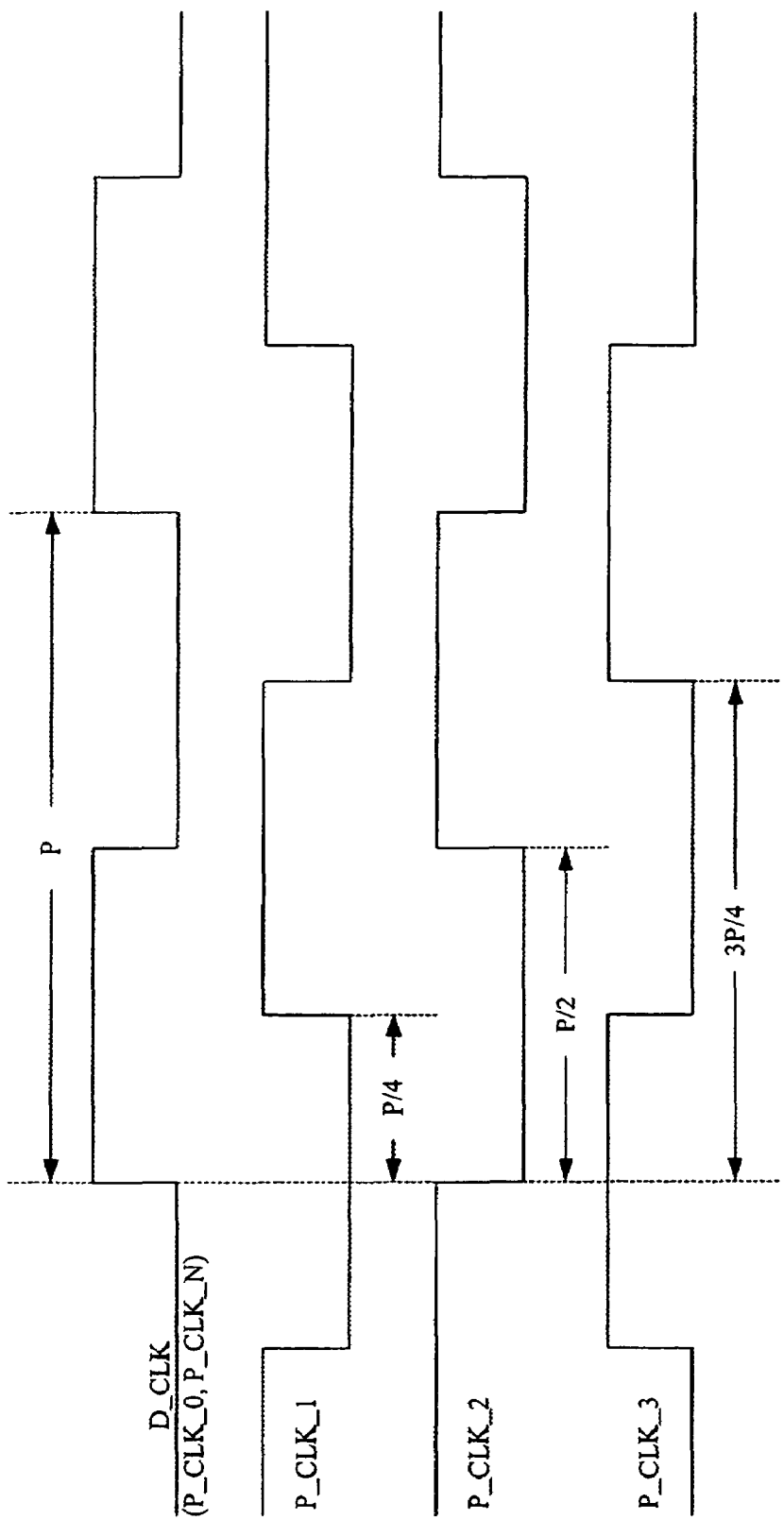
FIG. 7 is a timing diagram for the delay lock loop of FIG. 6.

FIG. 7 illustrates for a timing diagram for delay lock loop 600 (FIG. 6) wherein N equals 4. Specifically, clock phase shifter 650 generates phase-shifted clock signal P_CLK_1 90 degrees out of phase with delayed clock signal D_CLK. Thus, phase-shifted clock signal P-CLK_1 is delayed by one-fourth of clock period P. Clock phase shifter 650 generates phase-shifted clock signal P_CLK_2 180 degrees out of phase with delayed clock signal D_CLK. Thus, phase-shifted clock signal P_CLK_2 is delayed by half of clock period P. Finally, clock phase shifter 650 generates phase-shifted clock signal P_CLK_3 270 degrees out of phase with delayed clock signal D_CLK. Thus, phase-shifted clock signal P_CLK_3 is delayed by three-fourths of clock period P.

Returning to FIG. 6, clock phase shifter 650 provides the phase-shifted clock signals to various input terminals of output generator 640. In some embodiments of delay lock loop 600, clock phase shifter 650 can be configured using one or more configuration signals CFG on an optional configuration bus 660. An embodiment of clock phase shifter 650 that is configured by configuration signals CFG is described below with respect to FIG. 10. Configuration signals CFG are received on configuration terminals 608 and are routed to clock phase shifter 650 and controller 630 by configuration bus 660. Output generator 640 selects either delayed clock signal D_CLK or one of the phase-shifted clock signals to provide as output clock signal O_CLK as dictated by controller 630 (described below). For embodiments of delay lock loop 600 in which clock phase shifter 650 provides phase-shifted clock signal P_CLK_N, output generator 640 can use phase-shifted clock signal P_CLK_N in place of delayed clock signal D_CLK. Controller 630 controls output generator 640.

Controller 630 receives phase information regarding reference clock signal REF_CLK and skewed clock signal S_CLK from phase detector 620. Specifically, phase detector 620 informs controller 630 whether propagation delay D from delay line 610 should be increased or decreased to achieve synchronization of skewed clock signal S_CLK with reference clock signal REF_CLK. For embodiments of phase detector 620 that only determine whether to increase or decrease propagation delay D, a jitter filter (not shown) can be used to reduce clock jitter. In one embodiment, the jitter filter is an up/down counter (not shown) that decrements by one if propagation delay D should be decreased and increments by one if propagation delay D should be increased. However, propagation delay D is not adjusted until the up/down counter reaches 0 or some other predetermined number. When propagation delay D is adjusted, the up/down counter is reset to one-half the maximum value. In other embodiments, phase detector 620 calculates the amount propagation delay D should be increased or decreased. During lock acquisition, controller 630 attempts to synchronize skewed clock signal S_CLK with reference clock signal REF_CLK so that initial propagation delay ID of propagation delay D is within a lock window W.

Figure 8:
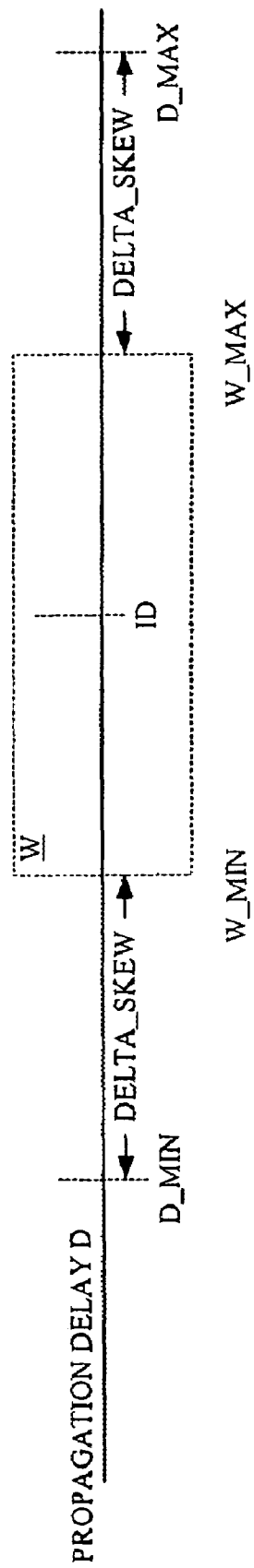
FIG. 8 illustrates a lock window as used in accordance with one embodiment of the present invention.

FIG. 8 illustrates the concepts of lock window W. As explained above, propagation delay D must be between minimum propagation delay D_MIN and maximum propagation delay D_MAX. Typical values for D_MIN and D_MAX are 3.2 nanoseconds and 46.8 nanoseconds, respectively. During lock acquisition, controller 630 ensures that initial propagation delay ID of propagation delay D is within lock window W. Specifically, when synchronization is first established initial propagation delay ID must be between lock window minimum W_MIN and lock window maximum W_MAX. The limits on lock window W are set to guarantee that once delay lock loop 600 completes locks acquisition, delay lock loop 600 can maintain synchronization as long as the system containing delay lock loop 600 operates within the design guidelines of the system.

For example, the system containing delay lock loop 600 generally can operate in a range of operating conditions. The range of operating conditions includes a maximum extreme condition in which propagation delay SKEW is maximized at a propagation delay value SKEW MAX. Similarly, the range of operating conditions also includes a minimum extreme condition in which propagation delay SKEW is minimized at a propagation delay value SKEW_MIN. Thus, the maximum change (DELTA_SKEW) in propagation delay SKEW during operation of the system is equal to propagation delay value SKEW_MAX minus propagation delay value SKEW_MIN (i.e., DELTA_SKEW=SKEW_MAX−SKEW_MIN). For maximum protection during lock maintenance, lock window minimum W_MIN can be equal to minimum propagation delay D_MIN plus DELTA_SKEW. Similarly, lock window maximum W_MAX can be equal to maximum propagation delay D_MAX minus DELTA_SKEW. In one embodiment of the present invention, lock window minimum W_MIN is equal to approximately 16.5% of maximum propagation delay D_MAX and lock window maximum W_MAX is equal to approximately 67.8% of maximum propagation delay D_MAX.

As explained above with respect to FIG. 1, for a conventional delay lock loop synchronization of skewed clock signal S_CLK with reference clock signal REF_CLK is achieved when propagation delay D plus propagation delay SKEW is equal to a multiple of period P. In equation form:

$$D+SKEW=MULT(P) \qquad (1)$$

where MULT(P) refers to a multiple of P. Usually, the smallest multiple of P greater than SKEW is used.

With delay lock loop 600, controller 630 can also use the delays from the phase-shifted clock signals. Thus delay lock loop 600 can achieve synchronization if propagation delay D plus a phase-shifted delay P_D from a phase-shifted clock signal plus propagation delay SKEW is a multiple of period P. In equation form:

$$D+P\_D\_Z+SKEW=MULT(P) \qquad (2)$$

where P_D_Z refers to a phase-shifted delay from phase-shifted clock signal P_CLK_Z. Usually, the smallest multiple of P greater than propagation delay SKEW plus phase-shifted delay P_D_Z is used. As explained above with respect to FIG. 6, in one embodiment of clock phase shifter 650 phase-shifted delay P_D_Z of a phase-shifted clock signal P_CLK_Z is equal to Z*(P/N), where Z is an integer between 0 and (N−1), inclusive. If Z is equal to 0, controller 630 causes output generator 640 to use delayed clock signal D_CLK as output clock signal O_CLK. Thus, phase-shifted delay P_D_0 is equal to 0.

For clarity, initial delay ID can be referred to initial delay ID_0 if output generator 640 uses delayed clock signal D_CLK for output clock signal O_CLK. Similarly, initial delay ID can be referred to as initial delay ID_Z, if output generator 640 uses phase-shifted clock signal P_CLK_Z for output clock signal O_CLK, where Z is a positive integer between 1 and (N−1), inclusive. Thus, at the end of lock acquisition, equation (2) can be rewritten as:

$$ID\_Z + P\_D\_Z + SKEW = MULT(P) \quad (3)$$

Re-arranging equation (3) provides:

$$ID\_Z = MULT(P) - SKEW - P\_D\_Z \quad (4)$$

and substituting Z*(P/N) for P_D_Z provides:

$$ID\_Z = MULT(P) - SKEW - Z*(P/N) \quad (5)$$

Usually, the smallest multiple of P that results in a positive initial delay ID_Z is used. In situations where initial delay ID_Z is less than minimum propagation delay D_MIN or greater than maximum propagation delay D_MAX, delay lock loop 600 cannot synchronize skewed clock signal S_CLK with reference clock signal REF_CLK using phase-shifted clock signal P_CLK_Z.

Because controller 630 can select any one of phase-shifted clock signals P_CLK_Z to drive output clock signal O_CLK, controller 630 can select from N initial delay values. The possible initial delay values range from a minimum offset value (MULT(P)−SKEW) to a maximum value (MULT(P)−SKEW) & (N−1)/N period P). The difference between each initial delay value is period P divided by N. For example, if N equals four, period P equals 40 nanoseconds, and propagation delay SKEW equals 25 nanoseconds; then initial delays ID_0, ID_1, ID_2, and ID_3 equal 15 nanoseconds, 5 nanoseconds, 35 nanoseconds, and 25 nanoseconds, respectively (as calculated using equation (5)). If N equals four, period P equals 40 nanoseconds, and propagation delay SKEW equals 55 nanoseconds; then initial delays ID_0, ID_, ID_2, and ID_3 equal 25 nanoseconds, 15 nanoseconds, 5 nanoseconds, and 35 nanoseconds, respectively. Thus, controller 630 is likely to find one or more initial delay values within lock window W. If more than one initial delay value is within lock window W, controller 630 can select any one of the initial delay values within lock window W.

Some embodiments of controller 630 can perform the calculations described above to determine which phase-shifted clock signal P_CLK_Z to use. However, other embodiments use trial and error to determine which phase-shifted clock signal P_CLK_Z to use. An embodiment of controller 630 that uses trial and error is described below with respect to FIG. 12.

Figure 9:
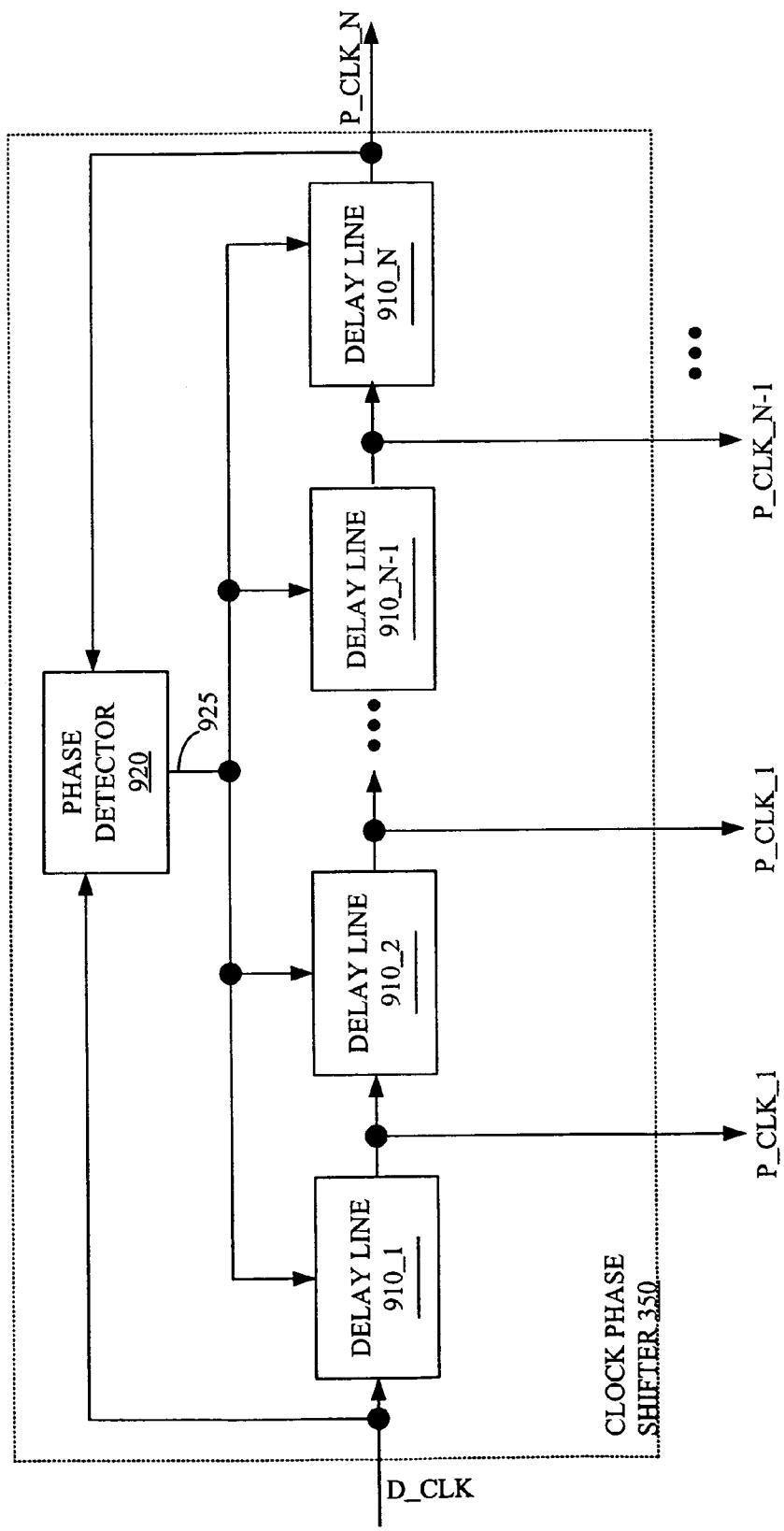
FIG. 9 is a block diagram of an embodiment of a clock phase shifter in accordance with the present invention.

FIG. 9 illustrates one embodiment of clock phase shifter 650 of FIG. 6. The embodiment of clock phase shifter 650 in FIG. 9 comprises a phase detector 920 and a plurality of delay lines 910_1 to 910_N. Delay lines 910_1 to 910_N are coupled in series. The input terminal of delay line 910_1 receives an input clock signal such as delayed clock signal D_CLK (FIG. 6). The output terminal of delay line 910_N is coupled to an input terminal of phase detector 920. Phase detector 920 also receives input clock signal D_CLK on another input terminal. Phase detector 920 controls all the delay lines in parallel via control line 925, and each delay line provides the same amount of propagation delay. Consequently, input clock signal D_CLK and the clock signal P_CLK−N on the output terminal of delay line 910_N are synchronized, i.e., in phase. Further, phase detector 920 causes the total propagation delay generated by delay lines 910_1 to 910_N to be equal to one period P of the input clock. Thus, each delay line provides a propagation delay of P/N. Thus, the output terminal of delay line 910_1 provides a clock signal that is delayed from the input clock signal by P/N whereas the output terminal of delay line 910_2 provides a clock signal that is delayed from the input clock signal by 2*P/N. In general, the output terminal of delay line 910Z provides a clock signal that is delayed from the input clock signal by Z*P/N, where Z is an integer between 1 and N−1, inclusive. Accordingly, if the input clock signal is delayed clock signal D_CLK, the output terminals of delay lines 910_1 to 910_N−1 provide phase-shifted clock signals P_CLK_1 to P_CLK_N−1, respectively. Some embodiments of clock phase shifter 650 also generate a clock signal P_CLK_N on the output terminal of delay line 910_N that has the same phase as delayed clock signal D_CLK.

Figure 10:
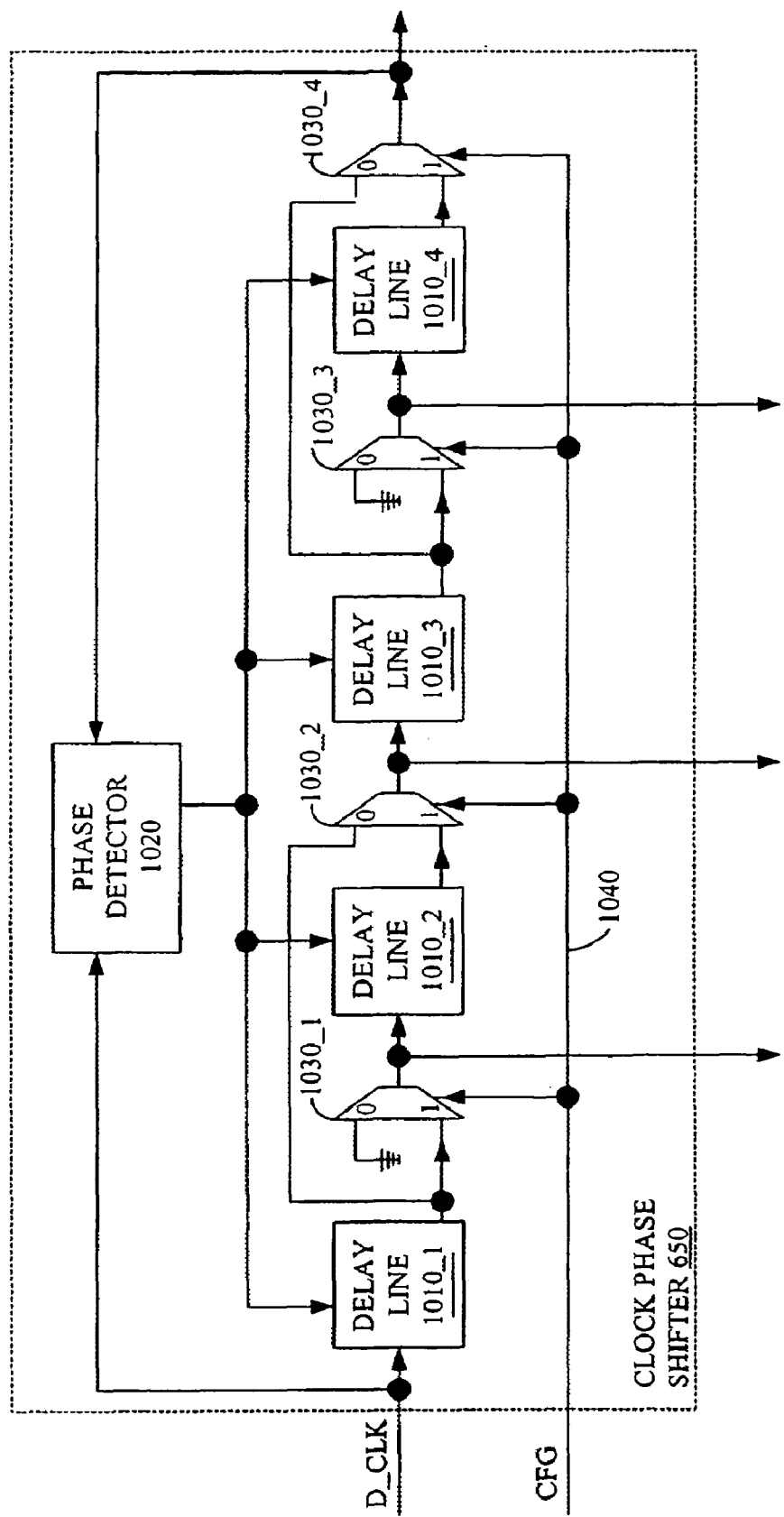
FIG. 10 is a block diagram of another embodiment of a clock phase shifter in accordance with the present invention.

FIG. 10 shows a configurable embodiment of clock phase shifter 650 of FIG. 6. Specifically, the clock phase shifter of FIG. 10 can be configured in a first mode to produce three phase-shifted clock signals that are 90 degrees, 180 degrees, and 270 degrees out of phase with an input clock signal. In a second mode, the clock phase shifter of FIG. 10 produces a single phase-shifted clock signal that is 180 degrees out of phase with the input clock signal. The clock phase shifter of FIG. 10 comprises a phase detector 1020, delay lines 1010_1, 1010_2, 1010_3, and 1010_4, and multiplexers 1030_1, 1030_2, 1030_3, and 1030_4. A configuration line 1040 is coupled to the select terminal of multiplexers 1030_1 to 1030_4.

The input terminal of delay line 1010_1 is coupled to receive an input clock signal such as delayed clock signal D_CLK (FIG. 6). The output terminal of each delay line 1010_Z is coupled to the logic one input terminal of multiplexer 1030_Z, where Z is an integer between 1 and 4, inclusive. The output terminal of each multiplexer 1030_Z is coupled to the input terminal of delay line 1010_Z+1, where Z is an integer between 1 and 3, inclusive. The output terminal of multiplexer 1030_4 is coupled to an input terminal of phase detector 1020. The logic zero input terminals of multiplexer 1030_1 and multiplexer 1030_3 are coupled to ground. However, the logic zero input terminal of multiplexer 1030_2 is coupled to the output terminal of delay line 1010_1. Similarly, the logic zero input terminal of multiplexer 1030_4 is coupled to the output terminal of delay line 1010_3. Phase detector 1020 also receives input clock signal D_CLK on another input terminal. Phase detector 1020 controls delay lines 1010_1 to 1010_4 in parallel as described above with respect to phase detector 920.

If configuration line 1040 is pulled to logic one, which puts the embodiment of FIG. 10 into the first mode, delay lines 1010_1 to 1010_4 are coupled in series. In the first mode, each delay line provides a delay of P/4. Thus, if the input clock signal is delayed clock signal D_CLK, the output terminal of each multiplexer 1030_Z can provide phase-shifted clock signals P_CLK_1, P_CLK_2, and P_CLK_3.

However, if configuration line 1040 is pulled to logic zero, which puts the embodiment of FIG. 10 into the second mode, only delay line 1010_1 and delay line 1010_3 are coupled in series. Delay lines 1010_2 and 1010_4 have their input terminal coupled to ground through multiplexers 1030_1 and 1030_3, respectively. In the second mode delay line 1010_1 and 1010_3 each provide a delay of P/2. Coupling the input terminals of delay lines 1010_2 and 1010_4 to ground reduces power consumption and switching noise. However, in the second mode the embodiment of FIG. 10 produces only one output clock signal, which is 180 degrees out of phase with the input clock signal and is generated at the output terminal of multiplexer 1030_2.

Figure 11:
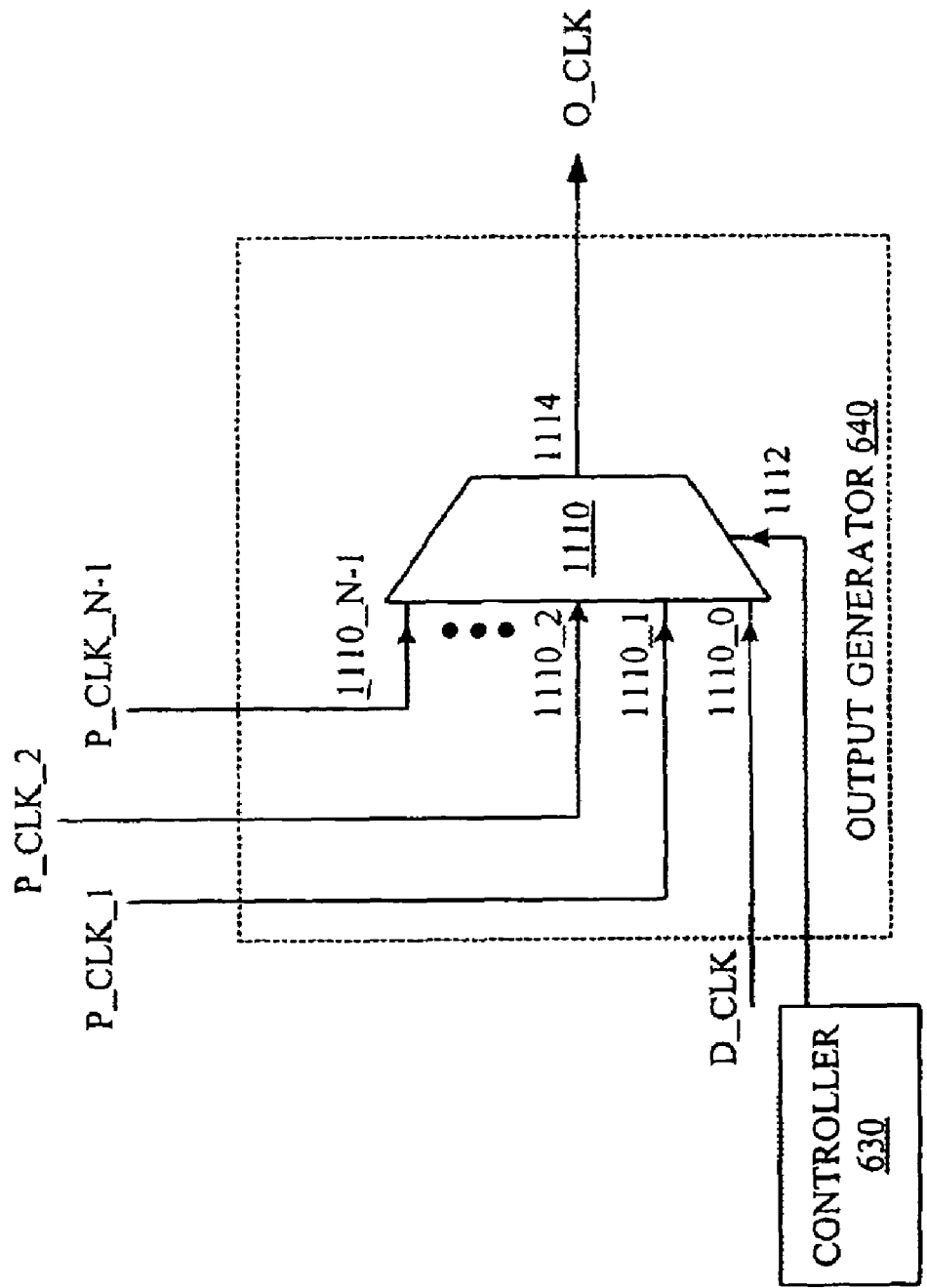
FIG. 11 is a block diagram of an output generator in accordance with the present invention.

FIG. 11 shows one embodiment of output generator 640 of FIG. 6. The output generator of FIG. 11 comprises an N-input multiplexer 1110. N-input multiplexer 1110 has N input terminals, referenced as 1110_0 to 1110_N–1, select terminals 1112, and an output terminal 1114. When the embodiment of output generator 640 of FIG. 11 is used in delay lock loop 600 of FIG. 6, select terminals 1112 are coupled to controller 630, input terminal 1110_0 is coupled to receive delayed clock signal D_CLK, output terminal 1114 provides output clock signal O_CLK, and input terminals 1110_1 to 1110_N–1 are coupled to receive phase-shifted clock signals P_CLK_1 to P_CLK_N–1, respectively. Select signals on select terminals 1112 determine which input signal is provided on output terminal 1114. Other embodiments of output generator 640 may include additional circuitry, such as clock buffers and clock dividers. In addition, some embodiments of output generator 640 drive additional clock signals, such as various versions of the phase-shifted clock signals.

Figure 12:
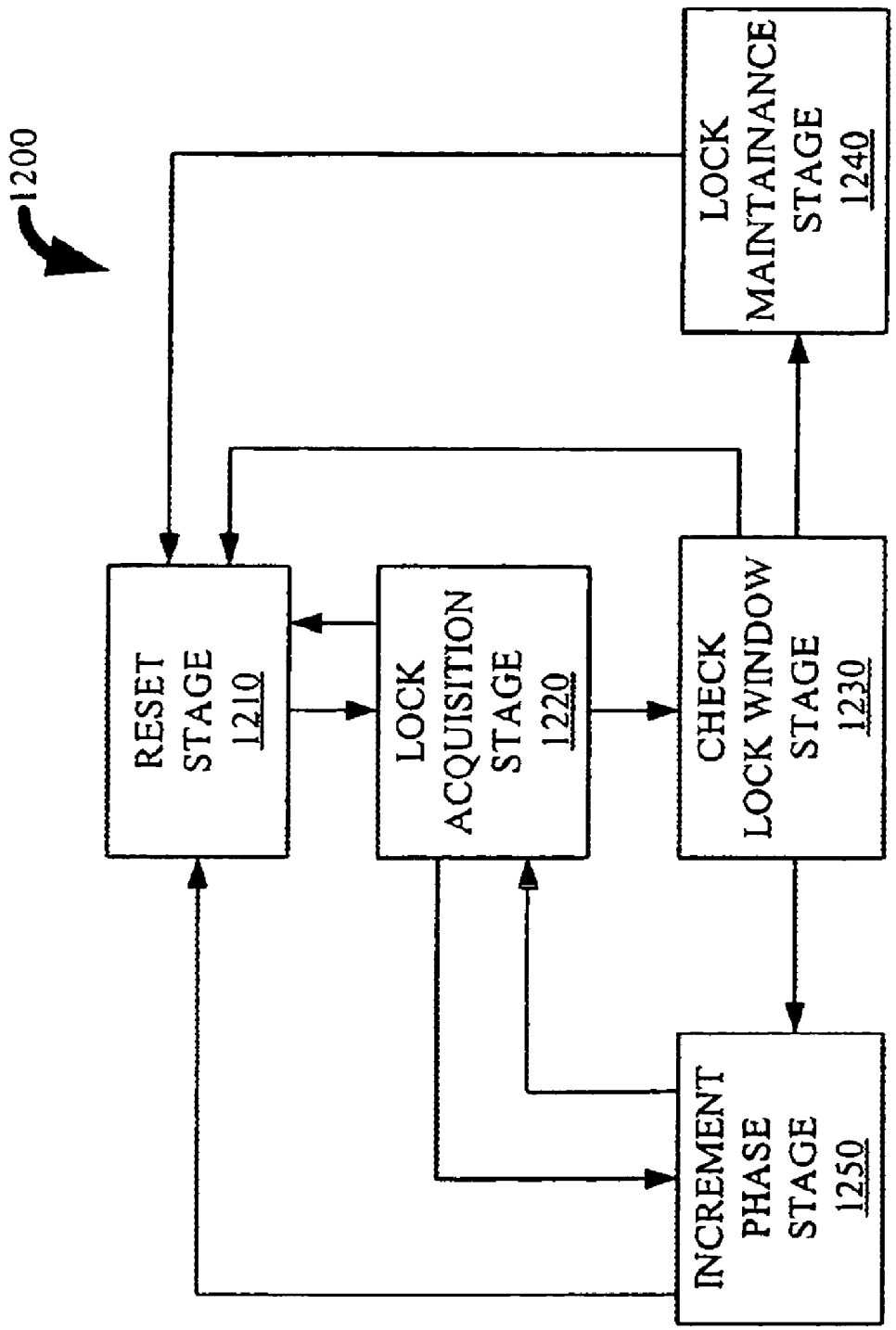
FIG. 12 is a state diagram for an embodiment of a controller in accordance with the present invention.

FIG. 12 shows a state diagram 1200 for one embodiment of controller 630 of FIG. 6. On power-up or reset, controller 630 transitions to a reset stage 1210. In reset stage 1210, controller 630 sets a phase counter (not shown) to zero, which causes output generator 640 to provide delayed clock signal D_CLK as output clock signal O_CLK, and adjusts propagation delay D of delay line 610 (FIG. 6) to a starting delay value. Starting delay values for propagation delay D include, for example, minimum propagation delay D_MIN, maximum propagation delay D_MAX, or the average of minimum propagation delay D_MIN and maximum propagation delay D_MAX. Controller 1210 then transitions to lock acquisition stage 1220.

In lock acquisition stage 1220, controller 630 synchronizes reference clock signal REF_CLK and skewed clock signal S_CLK. Specifically, controller 630 adjusts propagation delay D of delay line 610 based on signals from phase detector 620. Phase detector 620 determines whether propagation delay D must be increased or decreased to synchronize skewed clock signal S_CLK with reference clock signal REF_CLK. Lock acquisition is described above in greater detail with respect to FIGS. 6–9; therefore, the description is not repeated. In some embodiments, clock phase shifter 650 is also reset by the power-on/reset signal. For some of these embodiments, controller 630 does not adjust propagation delay D until after clock phase shifter 650 produces phase-shifted clock signals P_CLK_1 to P_CLK_N–1. If controller 630 cannot synchronize skewed clock signal S_CLK with reference clock signal REF_CLK, controller 630 transitions to increment phase stage 1250, described below. Otherwise, controller 630 transitions to check lock window stage 1230 after controller 630 synchronizes skewed clock signal S_CLK with reference clock signal REF_CLK (with an initial propagation delay ID in delay line 610).

In check lock window stage 1230, controller 630 must determine whether initial propagation delay ID is within lock window W. Specifically, propagation delay ID is within lock window W if propagation delay ID is greater than lock window minimum W_MIN and less than lock window maximum W_MAX. If initial propagation delay ID is not within lock window W, controller 630 transitions to increment phase stage 1250. Otherwise, controller 630 transitions to lock maintenance stage 1240.

In lock maintenance stage 1240, controller 630 adjust propagation delay D of delay line 610 to maintain synchronization of skewed clock signal S_CLK with reference clock signal REF_CLK. Lock maintenance is described above in greater detail; therefore, the description is not repeated. As described above, the present invention can maintain lock throughout the systems environment conditions. Therefore, controller 630 remains in lock maintenance stage 1240 unless a reset occurs that causes controller 630 to transition to reset stage 1210.

In increment phase stage 1250, controller 630 increments the phase counter, which causes output generator 640 to select a different phase-shifted clock signal. Further, controller 630 resets delay line 610 so that propagation delay D returns to the starting delay value used in reset stage 1210. Controller 630 then transitions to lock acquisition stage 1220 and proceeds as described above.

Figure 13:
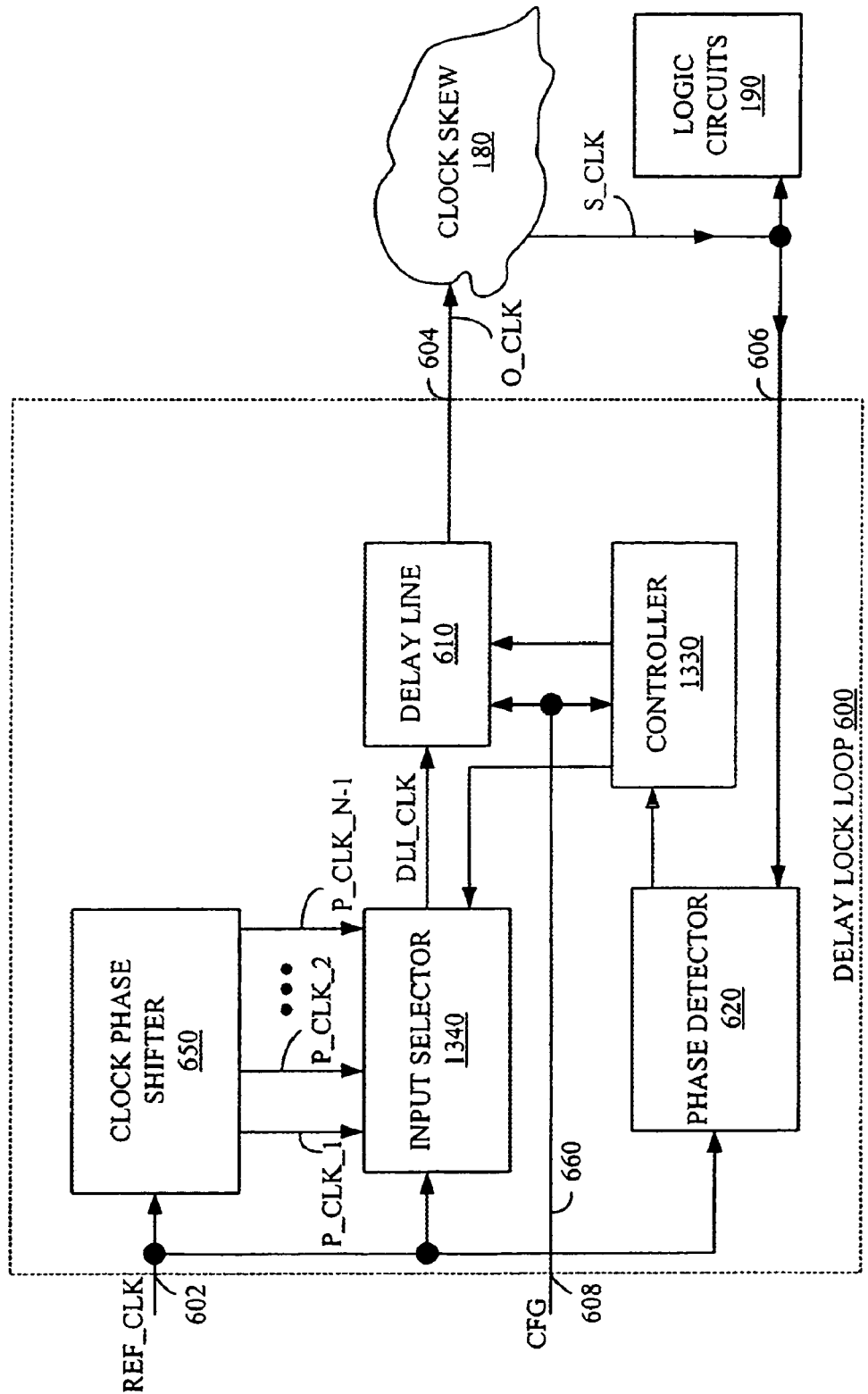
FIG. 13 is a block diagram of a system using another embodiment of a delay lock loop in accordance with the present invention.

FIG. 13 is a block diagram of another embodiment of delay lock loop 600. The embodiment of FIG. 13 uses the same principles as described above with respect to the embodiment of FIG. 6. However, in the embodiment of FIG. 13, clock phase shifter 650 generates phase-shifted clock signals P_CLK_1 to P_CLK_N–1 using reference clock signal REF_CLK. Reference clock signal REF_CLK and phase-shifted clock signals P_CLK_1 to P_CLK_N–1 are coupled to an input selector 1340. Input selector 1340 selects either reference clock signal REF_CLK or one of phase-shifted clock signals P_CLK_1 to P_CLK_N–1 as a delay line input clock signal DLI_CLK, which is provided to the input terminal of delay line 610. Delay line 610 drives output clock signal O_CLK. A controller 1330 controls input selector 1340 and delay line 610 based on the phase information provided by phase detector 620 so that delay line 610 provides a propagation delay D that synchronizes skewed clock signal S_CLK with reference clock signal REF_CLK. Input selector 1340 can be implemented using the same circuit design as output generator 640.

Figure 14A:
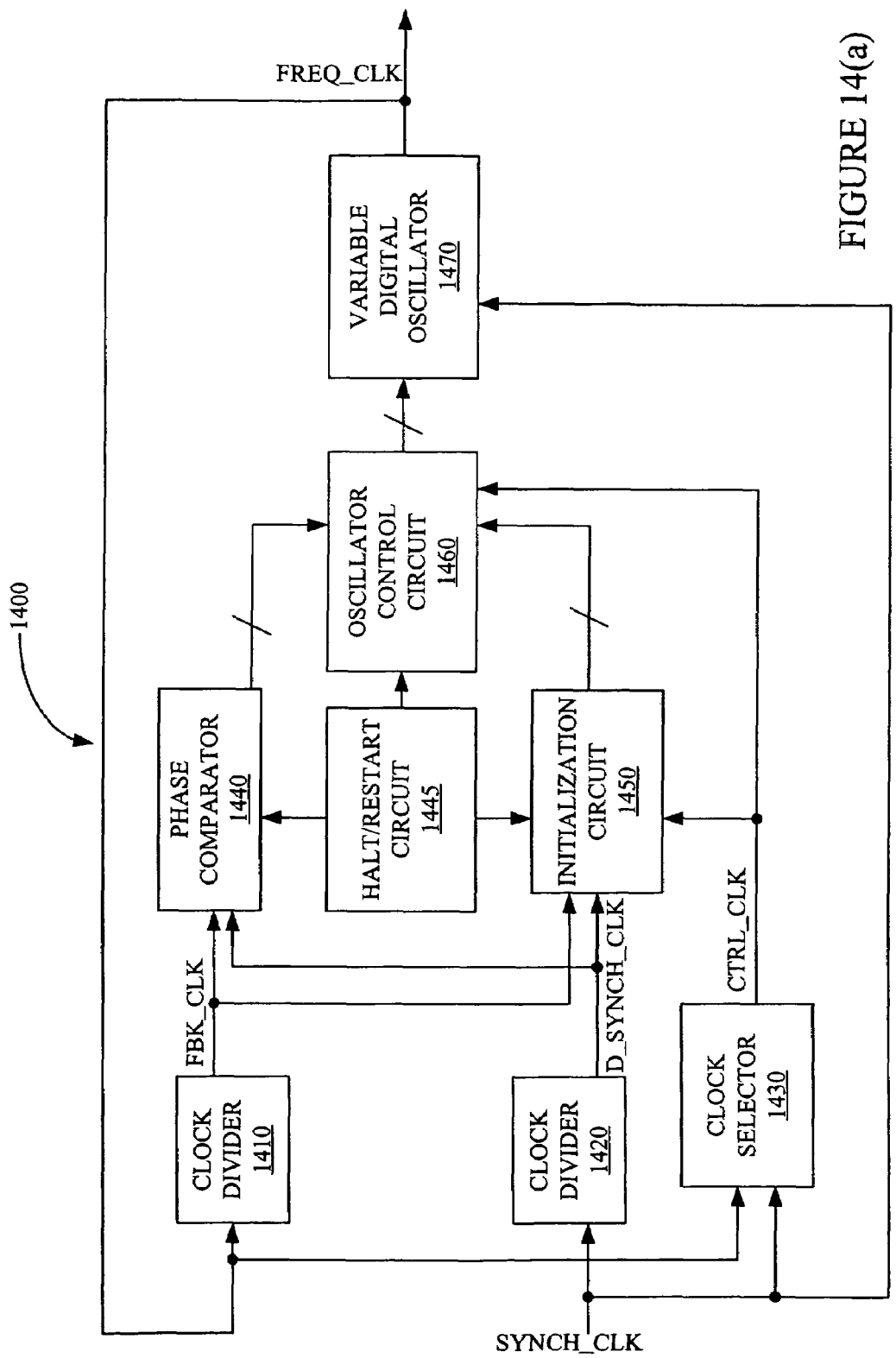
FIG. 14(a) is a block diagram of a variable clocking circuit in accordance with one embodiment of the present invention.

FIG. 14(a) is a block diagram of a digital frequency synthesizer 1400 in accordance with one embodiment of the present invention. Digital frequency synthesizer 1400 generates a frequency adjusted clock signal FREQ_CLK having a clock frequency F_ADJ equal to a clock frequency F_SYNCH of a synchronizing clock signal SYNCK_CLK multiplied by a multiplier M and divided by a divider D (i.e., F_ADJ=M*F_SYNCH/D). As explained above, when digital frequency synthesizer 320 is used with digital clock manager 300, 400, or 500, clock frequency F_SYNCH of synchronizing clock signal SYNCH_CLK is equal to clock frequency F_REF of reference clock signal REF_CLK. Digital frequency synthesizer 1400 comprises clock dividers 1410 and 1420, optional clock selector 1430, phase comparator 1440, halt/restart circuit 1445, initialization circuit 1450, oscillator control circuit 1460, and variable digital oscillator 1470. Clock divider 1410 receives frequency adjusted clock signal FREQ_CLK, which is generated by variable digital oscillator 1470, and generates feedback clock signal FBK_CLK having a frequency F_FBK equal to frequency F_ADJ of output clock FREQ_CLK divided by multiplier M. Clock divider 1410 drives feedback clock signal FBK_CLK to initialization circuit 1450 and phase comparator 1440. Clock divider 1420 receives synchronizing clock signal SYNCH_CLK and generates divided synchronizing clock signal D_SYNCH_CLK having a frequency F_D_SYNCH equal to frequency F_SYNCH of synchronizing clock signal SYNCH_CLK divided by divider D. Clock divider 1420 drives divided synchronizing clock signal D_SYNCH_CLK to initialization circuit 1450 and phase comparator 1440.

Clock selector 1430 receives both synchronizing clock signal SYNCH_CLK and frequency adjusted clock signal FREQ_CLK and selectively drives either synchronizing clock signal SYNCH_CLK or frequency adjusted clock signal FREQ_CLK as control clock signal CTRL_CLK to initialization circuit 1450 and oscillator control circuit 1460. Generally, synchronizing clock signal SYNCH_CLK is used during a coarse frequency search phase. Then, frequency adjusted clock signal FREQ_CLK is used for a fine frequency search phase as well as during a clock maintenance phase, i.e., maintaining the frequency of frequency adjusted clock signal FREQ_CLK at the selected frequency. The coarse frequency search phase, the fine frequency search phase, and the maintenance phase for one embodiment of the present invention is described in detail below. Halt/restart circuit 1445, which is used during coarse frequency search phase and the fine frequency search phase, is described below.

At power-on or reset, initialization circuit 1450 controls oscillator control circuit 1460 to tune variable digital oscillator 1470 to generate frequency adjusted clock signal FREQ_CLK. Specifically, initialization circuit 1450 tunes variable digital oscillator 1470 so that frequency F_ADJ of frequency adjusted clock signal FREQ_CLK is equal to a selected frequency F_SEL, which equals frequency F_SYNCH of synchronizing clock signal SYNCH_CLK multiplied by multiplier M and divided by divider D. After frequency F_ADJ of frequency adjusted clock signal FREQ_CLK reaches selected clock frequency F_SEL, initialization circuit 1450 passes control of oscillator control circuit 1460 and variable digital oscillator 1470 to phase comparator 1440. Phase comparator 1440 tunes variable digital oscillator 1470 to maintain frequency F_ADJ at selected frequency F_SEL despite environmental changes such as temperature.

Some embodiments of digital frequency synthesizer 1400 can use conventional clock dividers, clock selectors, halt/restart circuits, and phase comparators. However, detailed descriptions of specific embodiments of initialization circuits 1450, oscillator control circuit 1460, and variable digital oscillator 1470 are described below.

Figure 14B:
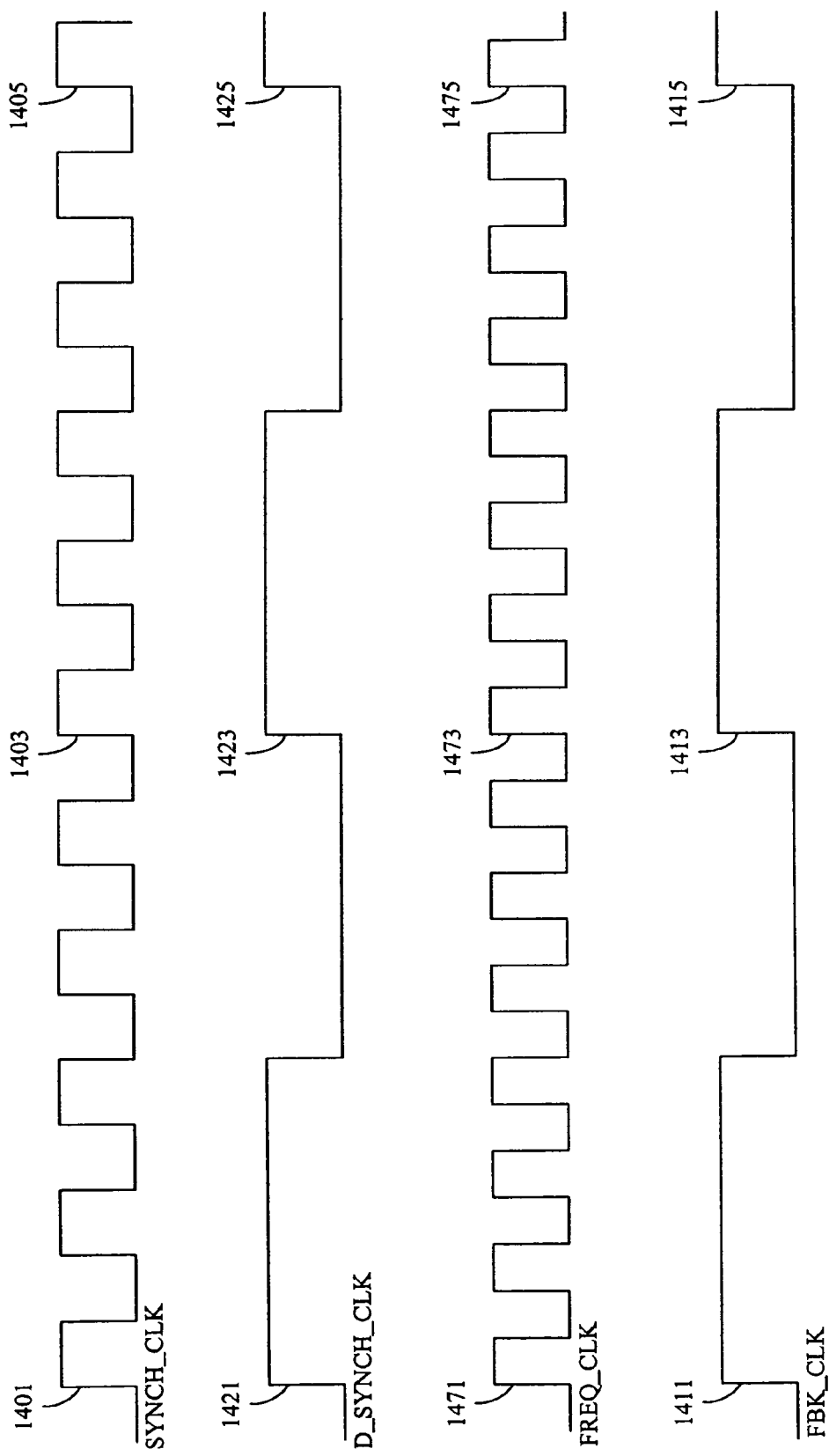
FIG. 14(b) is a timing diagram for the variable clocking circuit of FIG. 14(a).

FIG. 14(*b*) is a timing diagram for digital frequency synthesizer 1400. For clarity, FIG. 14(*b*) is idealized and omit such factors as propagation delay and skewing. In FIG. 14(*b*), multiplier M is equal to 7 and divider D is equal to 5. Thus, as shown in FIG. 14(*b*), divided synchronizing clock signal D_SYNCH_CLK has a rising edge, such as rising edges 1421, 1423, and 1425, at every fifth rising edge of synchronizing clock signal SYNCH_CLK, i.e., at rising edges 1401, 1403, and 1405. Similarly, feedback clock signal FBK_CLK has a rising edge, such as rising edges 1411, 1413, and 1415, every seventh rising edge of frequency adjusted clock signal FREQ_CLK, i.e., at rising edges 1471, 1473 and 1475. When frequency F_ADJ of frequency adjusted clock signal FREQ_CLK is equal to selected frequency F_SEL and synchronizing clock signal SYNCH_CLK is in phase with frequency adjusted clock signal FREQ_CLK, feedback clock signal FBK_CLK and divided synchronizing clock signal D_SYNCH_CLK have the same phase and frequency. Accordingly, initialization circuit 1450 and phase comparator 1440 tune variable digital oscillator 1470 to match the phase and frequency of divided synchronizing clock signal D_SYNCH_CLK and feedback clock signal FBK_CLK to drive frequency adjusted clock signal FREQ_CLK at selected frequency F_SEL. When the phase and frequency of divided synchronizing clock signal D_SYNCH_CLK and feedback clock signal FBCK_CLK match, every Mth rising edge of frequency adjusted clock signal FREQ_CLK aligns with a rising edge of synchronizing clock signal SYNCH_CLK. For example, rising edges 1471 and 1473 of frequency adjusted clock signal FREQ_CLK align with rising edges 1401 and 1403 of synchronizing clock signal SYNCH_CLK. The alignments are commonly referred to as concurrences. The time between two consecutive concurrences is commonly referred to as a concurrence period.

Figure 15:
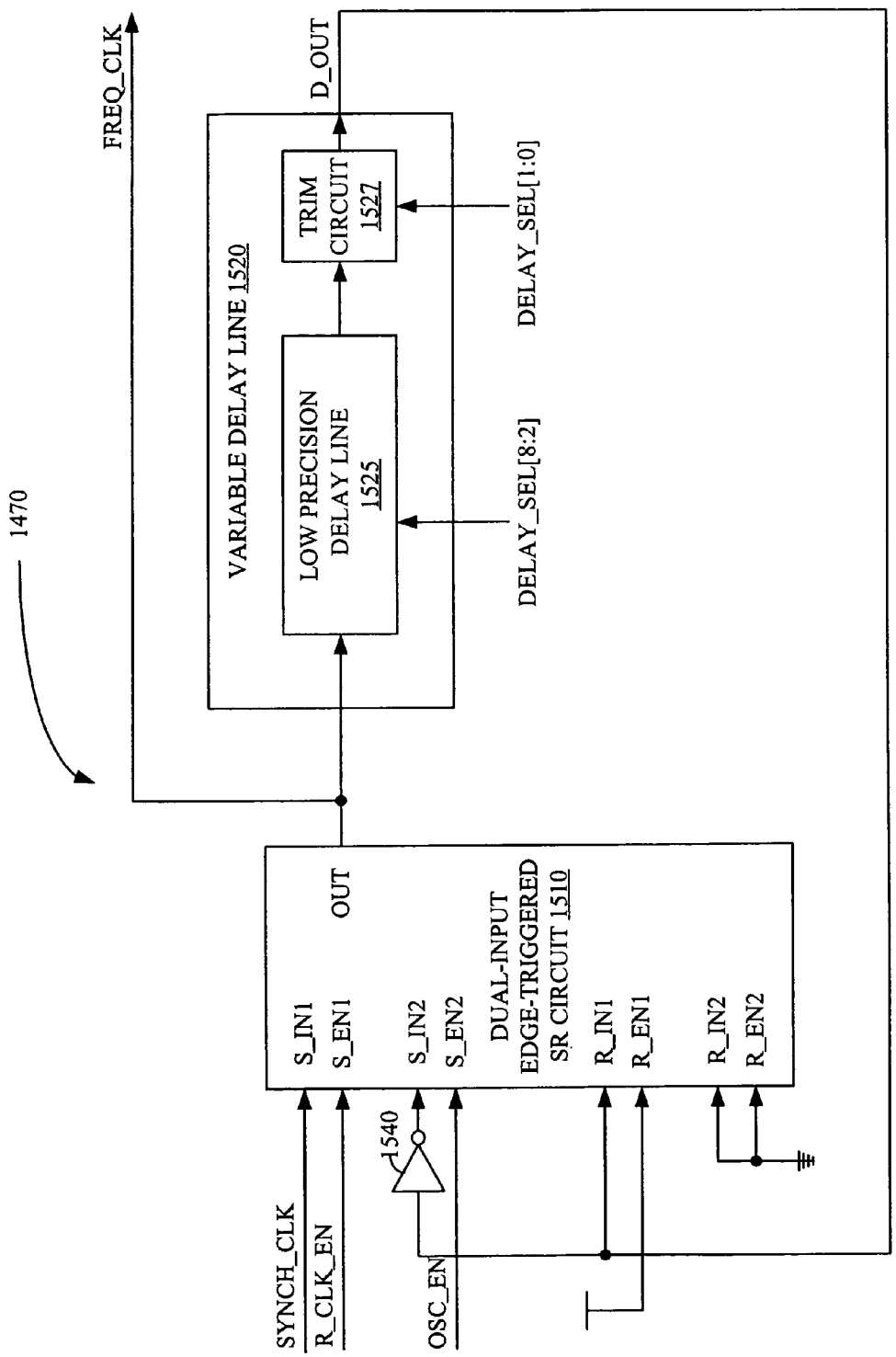
FIG. 15 is schematic diagram of a variable digital oscillator in accordance with one embodiment of the present invention.

FIG. 15 is a block diagram of an embodiment of variable digital oscillator 1470. The embodiment of FIG. 3 comprises a dual-input edge-triggered SR circuit 1510, an inverter 1540, and a variable delay line 1520 having a low precision delay line 1525 and a trim circuit 1527. Dual-input edge-triggered SR circuit 1510 includes a first set input terminal S_IN1, a first set enable input terminal S_EN1, a second set input terminal S_IN2, a second set enable input S_EN2, a first reset input terminal R_IN1, a first reset enable input terminal R_EN1, a second reset input terminal R_IN2, a second reset enable input terminal R_EN2, and an output terminal OUT. Operation and construction of dual-input edge-triggered SR circuits are well known in the art and therefore are not described in detail herein. Table 1 provides a truth table for an active high version of dual-input edge-triggered SR CIRCUIT 1510. Basically, an active (e.g., rising) edge of a set input signal on a set terminal while the corresponding set enable signal at the set enable terminal is at an enabled logic level (e.g., logic high) causes output terminal OUT to drive an output signal to an active state (e.g., logic high). Conversely, an active (e.g., rising) edge on a reset input signal on a reset terminal while the corresponding reset enable signal on the corresponding reset enable terminal is at an enabled logic level (e.g., logic high) causes output terminal OUT to drive an output signal to an inactive state (e.g., logic low). For clarity, the circuits herein are described using logic high as the enabled logic level and the active logic level. Similarly, rising edges are used as the active edges. However, those skilled in the art can apply the principles 2 of the present invention using different enabled logic 3 levels, active logic levels, and active edges.

TABLE 1

| S_IN1 | S_EN1 | S_IN2 | S_EN2 | R_IN1 | R_EN1 | OUT |
|---|---|---|---|---|---|---|
| RE | H | X | X | X | X | H |
| X | X | RE | H | X | X | H |
| X | X | X | X | RE | H | L | where RE is a rising edge, H is logic high, L is logic low, and X is a do not care condition.

Synchronizing clock signal SYNCH_CLK is coupled to first set input terminal S_IN1 and a reference clock enable signal R_CLK_EN is coupled to first enable input terminal S_EN1. Output terminal OUT of dual edge-triggered SR CIRCUIT 1510 drives frequency adjusted clock signal FREQ_CLK and is coupled to variable delay line 1520. In the embodiment of FIG. 15, variable delay line 1520 is implemented using a low precision delay line 1525 have a base delay BD and a trim circuit 1527 that provides a delay of 0, 0.25, 0.50, or 0.75 times base delay BD. Other embodiments of the present invention can use conventional variable delay lines. Variable delay line 1520 delays the output signal of dual-input edge-triggered SR circuit 1510 by a variable amount under the control of oscillator control circuit 1460 to generate delayed output signal D_OUT. Delayed output signal D_OUT is coupled to first reset input signal R_IN1 as well as the input terminal of inverter 1540. The output terminal of inverter 1540 is coupled to second set input terminal S_IN2. An oscillator enable signal OSC_EN is coupled to second set enable terminal S_EN2. Under normal operations, oscillator enable signal OSC_EN is in the logic high state to enable variable digital oscillator 1470. Therefore, a rising edge from output terminal OUT that is delayed by variable delay line 1520 causes dual-input edge-triggered SR circuit 1510 to transition to logic low. Conversely, a falling edge from output terminal OUT that is delayed by variable delay line 1520 and inverted by inverter 1540 causes dual-input edge-triggered SR circuit 1510 to transition to logic high. Thus, variable digital oscillator 1470 generates a clock signal such as frequency adjusted clock signal FREQ_CLK. The frequency of frequency adjusted clock signal FREQ_CLK is controlled by the amount of delay provided by variable delay line 1520.

In the embodiment of FIG. 15, low precision variable delay line 1525 provides a variable delay ranging from 0 to 127 times low precision base delay LBD, where low precision base delay LBD is the smallest non-zero delay provided by low precision variable delay 1525. Furthermore, trim circuit 1530 provides an additional delay of 0, 0.25, 0.5 or 0.75 base delay units. Thus, in the embodiment of FIG. 15, variable delay line 1520 can provide 512 delay values ranging from 0 to 127.75 low precision base delay LBD in multiples of 0.25 low precision base delay LBD. Thus, in the embodiment of FIG. 15, variable delay line 1520 provides a delay between 0 and 511 times a base delay BD, which is equal to 0.25 times low precision base delay LBD.

Figure 16:
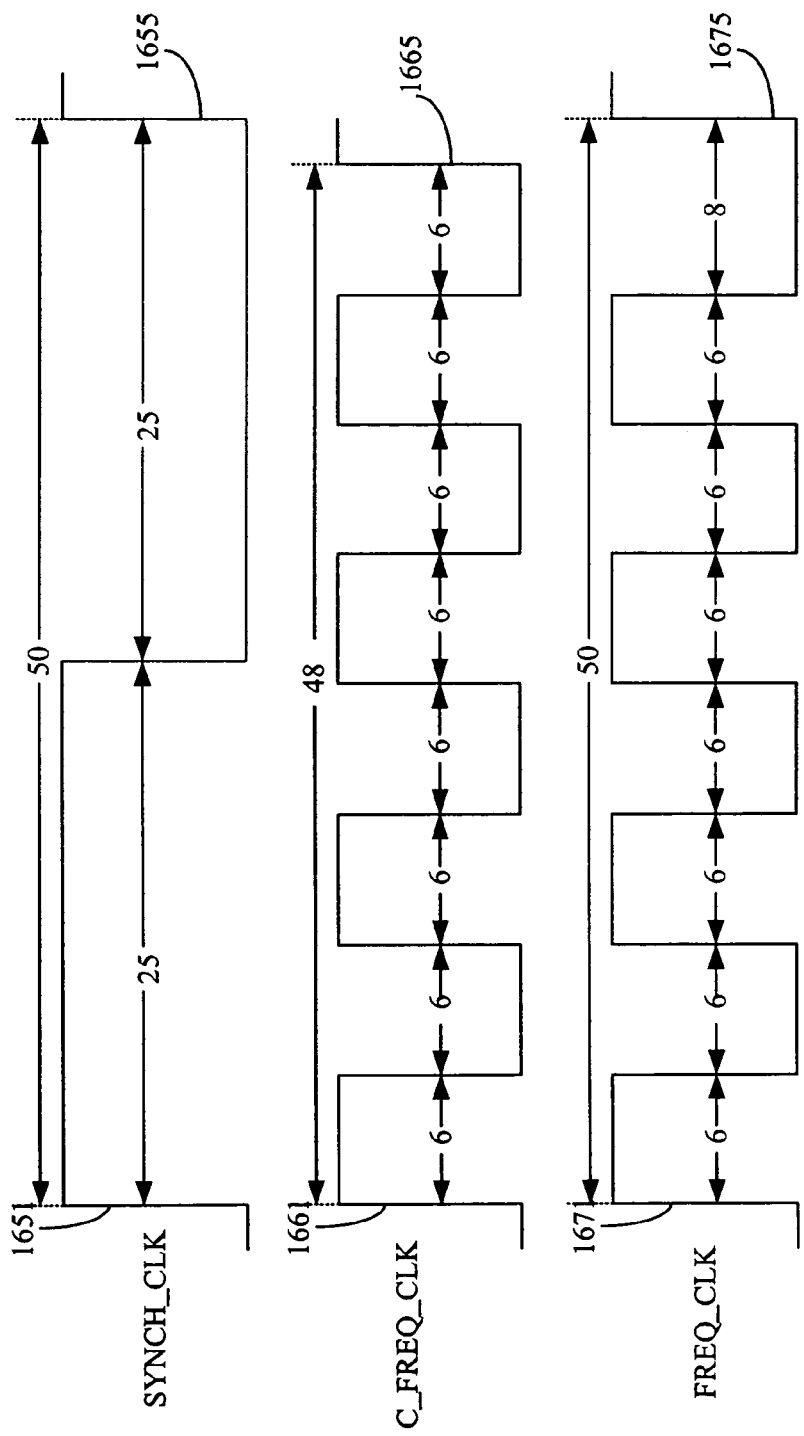
FIG. 16 is a timing diagram for the variable clocking circuit of FIG. 14(a) using the digital oscillator of FIG. 15.

Depending on the frequency F_SYNCH of synchronizing clock signal SYNCH_CLK, multiplier M, and divisor D, variable delay line 1520 may not be able to provide the exact amount of delay necessary to generate frequency adjusted clock signal FREQ_CLK at selected frequency F_SEL. FIG. 16 illustrates this problem of using digital delay lines in clock generation circuits. Specifically, FIG. 16 shows a synchronizing clock signal SYNCH_CLK, a conventional frequency adjusted clock signal C_FREQ_CLK, and an frequency, adjusted clock signal FREQ_CLK generated using a dual-input edge-triggered SR circuit 1510 in accordance with one embodiment of the present invention. In FIG. 16, rising edges 1651, 1661, and 1671 of synchronizing clock signal SYNCH_CLK, conventional frequency adjusted clock signal C_FREQ_CLK, and frequency adjusted clock signal FREQ_CLK, respectively, are synchronized.

In FIG. 16, multiplier M is equal to 4 and divider D is equal to 1. Synchronizing clock signal SYNCH_CLK has a period of 50 nanoseconds. Accordingly, 25 nanoseconds separates each consecutive clock edge in synchronizing clock signal SYNCH_CLK. Ideally, variable delay line 1520 would provide a delay of 6.25 nanoseconds, which is equal to 25 divided by 4. However, if the base delay unit of variable delay line 1520 (FIG. 15) is one nanosecond, then variable delay line 1520 is configured to provide 6 nanoseconds of delay between consecutive edges of frequency adjusted clock signal FREQ_CLK1. As explained above, during concurrence, i.e., every 4 periods, the rising edge of conventional frequency adjusted clock signal C_FREQ_CLK should occur at the same time as the rising edge of synchronizing clock signal SYNCH_CLK. However, as illustrated in FIG. 16, rising edge 1665 of conventional output clock C_FREQ_CLK precedes rising edge 1655 of synchronizing clock signal SYNCH_CLK by 2 nanoseconds. The two nanosecond misalignment reoccurs every concurrence period. Thus, over time the misalignment can cause serious synchronization problems in digital systems.

To eliminate the misalignment, just prior to concurrence, i.e., when a rising edge of synchronizing clock signal SYNCH_CLK should be aligned with a rising edge of frequency adjusted clock signal FREQ_CLK, oscillator enable signal OSC_EN is deasserted and reference clock enable signal is asserted. Thus, during a concurrence the rising edge of synchronizing clock signal SYNCH_CLK on input terminal S_IN1 of dual-input edge-triggered SR circuit 1510 causes a rising edge on output terminal OUT of dual-input edge-triggered SR circuit 1510, which drives frequency adjusted clock signal FREQ_CLK. After concurrence, oscillator enable signal OSC_EN is reasserted and reference clock enable signal R_CLK_EN is deasserted. Thus, every Mth clock period of frequency adjusted clock signal FREQ_CLK, frequency adjusted clock signal FREQ_CLK is realigned with synchronizing clock signal SYNCH_CLK even if variable delay line 1520 does not provide the exact delay necessary to drive frequency adjusted clock signal FREQ_CLK at selected frequency F_SEL.

Accordingly, as shown in FIG. 16, rising edge 1675 of frequency adjusted clock signal FREQ_CLK is aligned with rising edge 1655 of synchronizing clock signal SYNCH_CLK. Therefore, the time between falling edge 1671 of frequency adjusted clock signal FREQ_CLK and rising edge 1675 of frequency adjusted clock signal FREQ_CLK is 8 nanoseconds rather than 6 nanoseconds. Thus, the time period during a concurrence cycle of frequency adjusted clock signal FREQ_CLK is equal to 50 nanoseconds rather than 48 nanoseconds as would be dictated by using only variable delay line 1520 to control the clock edges of frequency adjusted clock signal FREQ_CLK. Consequently, the average frequency of frequency adjusted clock signal FREQ_CLK over an concurrence period is equal to selected frequency F_SEL.

Figure 17:
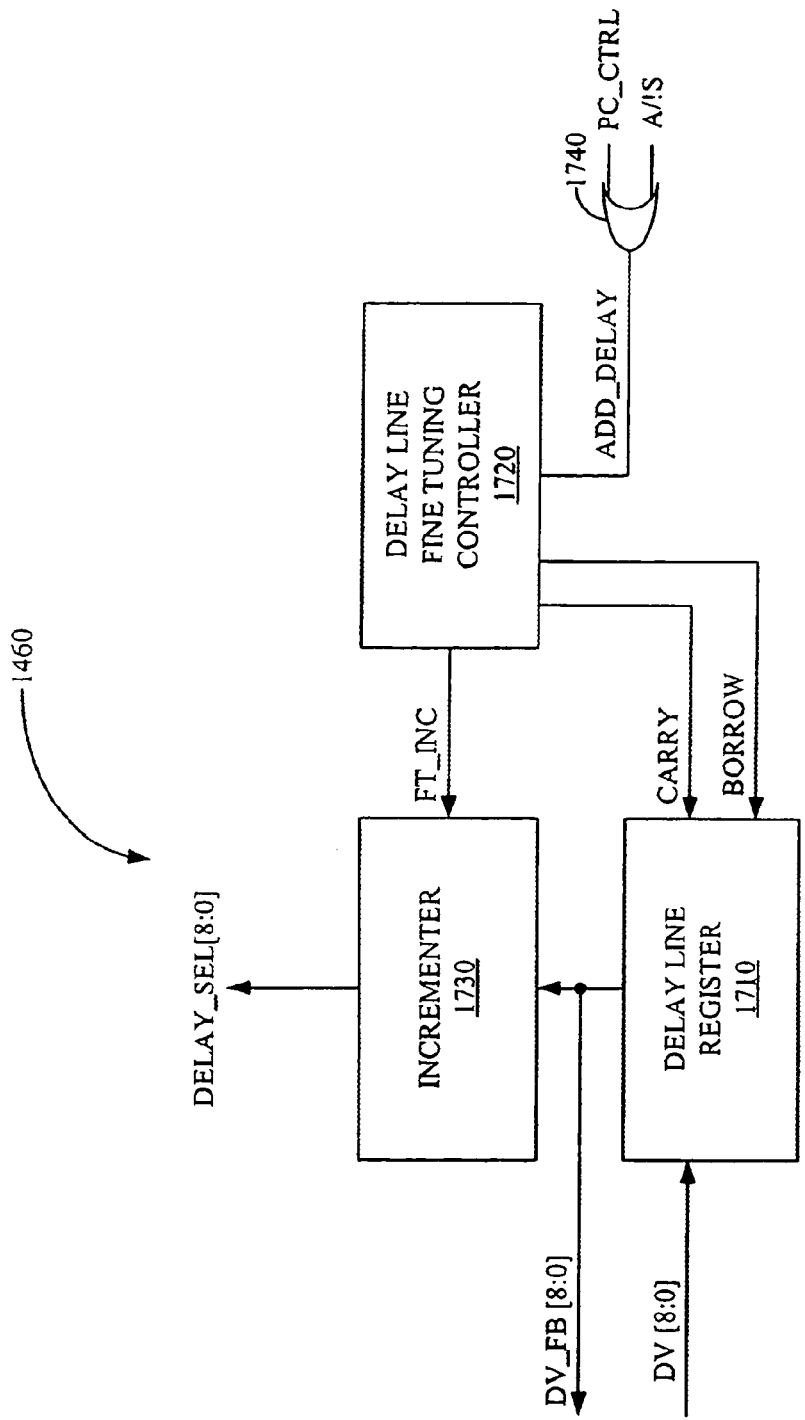
FIG. 17 is a block diagram of an oscillator control circuit in accordance with one embodiment of the present invention.

FIG. 17 is a block diagram of oscillator control circuit 1460 in accordance with one embodiment of the present invention. The embodiment of FIG. 17 includes a delay line register 1710, an optional incrementer 1730, an optional delay line fine tuning controller 1720, and an optional OR gate 1740. Delay line register 1710 receives a delay value DV[8:0] from initialization circuit 1450 (FIG. 14). The contents of delay line register 1710 are provided to incrementer 1730 and initialization circuit 1450 as delay value feedback signals DV_FB[8:0]. Initialization circuit 1450 adjusts delay value DV[8:0] during the coarse frequency search phase to match frequency F_ADJ of frequency adjusted clock signal FREQ_CLK with selected frequency F_SEL as described below. Delay line register 1710 also receives a carry signal CARRY and a borrow signal BORROW from delay line fine tuning controller 1720. IF delay line fine tuning controller 1720 is enabled, delay line register 1710 is configured to increment when carry signal CARRY is in the active logic level (e.g., logic high) and to decrement on when borrow signal BORROW is in the active logic level (e.g., logic high). Generation of carry signal CARRY and borrow signal BORROW is described below.

The delay value in delay line register 1710 is selectively incremented by incrementer 1730 to generate delay select signals DELAY_SEL[8:0], which are coupled to variable delay line 1520 (FIG. 15). Specifically, delay line fine tuning controller 1720 drives a fine tuning increment control signal FT_INC to incrementer 1730. If fine tuning increment control signal FT_INC is at an active logic level (e.g., logic high), then incrementer 1730 increments the value from delay line register 1710. Delay line fine tuning controller 1720 is controlled by frequency comparator 1450 using control signal A/!S or by phase comparator 1440 (FIG. 14(a)) using phase comparator control signal PC_CTRL. For the embodiment of FIG. 17, if delay line fine tuning controller 1720 is enabled then if either control signal A/!S or phase comparator signal PC_CTRL is in the active state (i.e., logic high) then delay line fine tuning controller 1720 is configured to add additional delay during a concurrence period. Thus, OR gate 1740 generates add delay signal ADD_DELAY from control signal A/!S and phase comparator control signal PC_CTRL. The use of delay line fine tuning controller 1720 is described in detail below.

Figure 18:
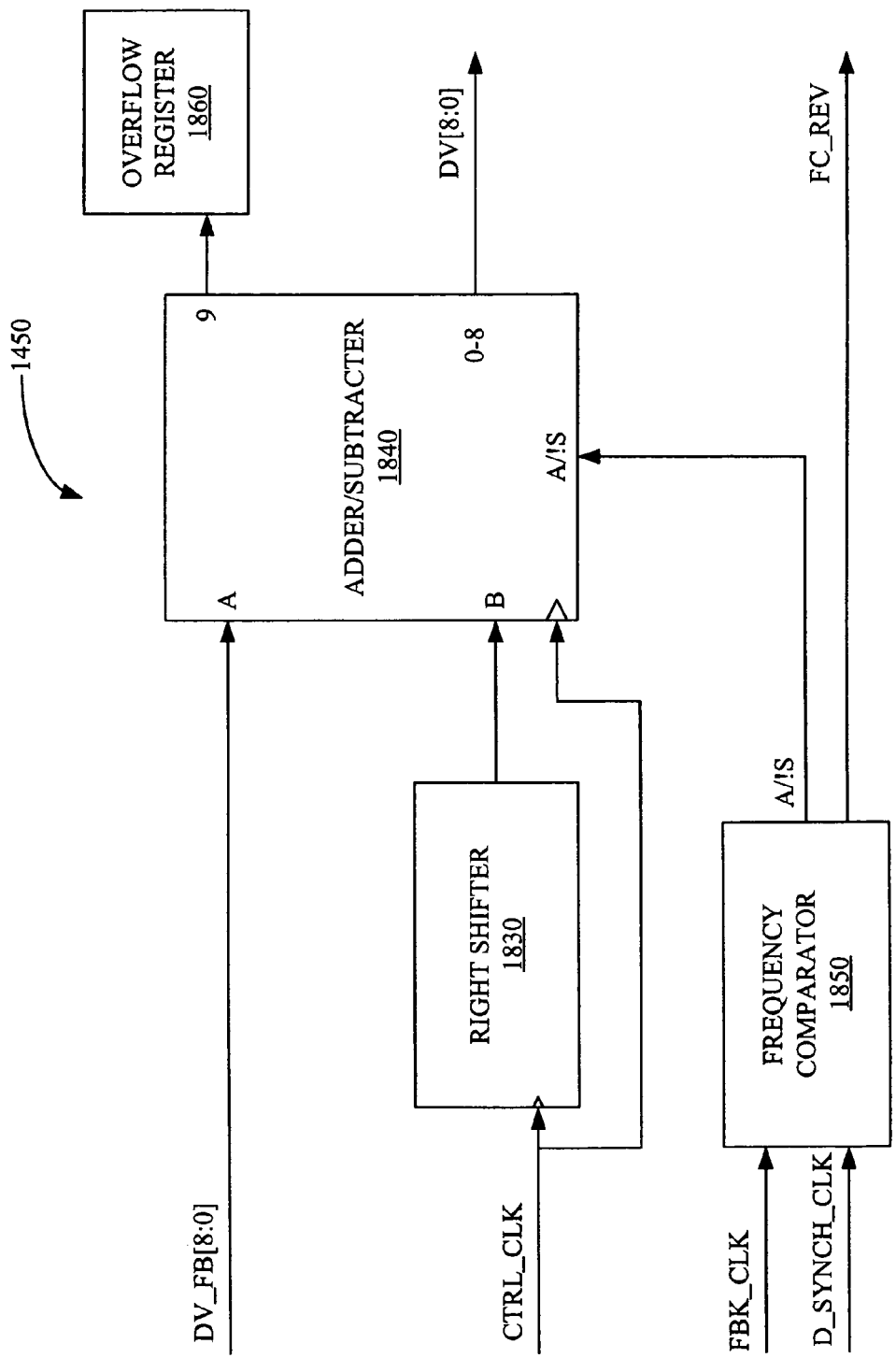
FIG. 18 is a block diagram of an initialization circuit in accordance with a second embodiment of the present invention.

FIG. 18 is a block diagram of initialization circuit 1450 in accordance with one embodiment of the present invention. Initialization circuit 1450 performs a coarse frequency search to set the value in variable delay line 1520. Specifically, during the coarse frequency search phase, the embodiment of FIG. 18 performs a fast binary search to determine delay value DV[8:0] for delay line register 1710, which causes frequency F_FBK of feedback clock FBK_CLK and frequency F_D_SYNCH of divided reference clock D_SYNCH_CLK to be equal. Other embodiments of initialization circuit 1450 may use other methods to select delay value DV8:0] for delay line register 1710. The embodiment of FIG. 18 comprises a right shift register 1830, an adder/subtracter 1840, a frequency comparator 1850, and an overflow register 1860.

Initially, adder/subtracter 1840 is configured to provide a delay value DV[8:0] that causes variable delay line 1520 to provide 50% of the maximum delay that can be provided by variable delay line 1520. For the embodiment of FIG. 15, delay value DV[8:0] is initially set at 256, i.e., halfway between 0 and 511. Right shift register 1830 is initially configured to be equal to half of the initial value of delay value DV[8:0]. Thus, for the embodiment of FIG. 15, right shifter 1830 is configured with an initial value of 128. Adder/subtracter 1840 is controlled by frequency comparator 1850 to either add the value in right shifter 1830 to the value in delay line register 1710 (FIG. 17) or to subtract the value in right shifter 1830 to the value in delay line register 1710. Specifically, the value in delay line register 1710 is provided by delay value feedback signals DV_FB[8:0]. After each addition or subtraction operation, the content of right shifter 1830 is "right shifted", which effectively divides the value in right shifter 1830 in half. However, right shifter 1830 maintains a minimum value of 1.

Frequency comparator 1850 receives feedback clock signal FBK_CLK and divided reference signal D_SYNCH_CLK and generates a control signal A/!S which dictates whether adder/subtracter 1840 performs an ADD operation or a SUBTRACT operation. Specifically, if frequency F_FBK of feedback clock signal FBK_CLK is greater than frequency F_D_SYNCH of divided synchronizing clock signal D_SYNCH_CLK, the delay provided by variable delay line should be increased. Accordingly, frequency comparator 1850 causes adder/subtracter 1840 to perform an ADD operation by driving control signal A/!S to the add logic level (typically logic high). Conversely, if frequency F_FBK of feedback clock signal FBK_CLK is less than frequency F_D_SYNCH of divided synchronizing clock signal D_SYNCH_CLK, the delay provided by variable delay line should be decreased. Accordingly, frequency comparator 1850 causes adder/subtracter 1840 to perform a SUBTRACT operation by driving control signal A/!S to the subtract logic level (typically logic low). After each addition or subtraction, halt/restart circuit 1445 (FIG. 14) halts and restarts initialization circuit 1450, and oscillator control circuit 1460 so that frequency adjusted clock signal FREQ_CLK is started in phase with synchronizing clock signal SYNCH_CLK. Halting and restarting allows frequency comparator 1850 to determine the proper value of control signal A/!S without having to compensate for phase variations. However, some embodiments of the present invention may use frequency comparators that automatically compensate for phase variations. For these embodiments, halting and restarting may not be necessary.

In some embodiments of the present invention, frequency comparator 1850 also generates a frequency comparator reversal signal FC_REV. Frequency comparator reversal signal FC_REV is driven to a active state (e.g., logic high) when frequency F_FBK of feedback clock signal FBK_CLK becomes greater than frequency F_D_SYNCH of divided synchronizing clock signal D_SYNCH_CLK and also when frequency F_D_SYNCH of divided synchronizing clock signal D_SYNCH_CLK becomes greater than frequency F_FBK of feedback clock signal FBK_CLK. In one embodiment of the present invention, a coarse frequency search phase ends when the value of right shifter 1830 is equal to one.

Table 2 provides an example of the operation for the embodiment of initialization circuit 1450 in FIG. 18. In the example of Table 2, a delay value DV of 371.5 provides the optimum delay for matching frequency F_FBK of feedback clock signal FBK_CLK to frequency F_D_SYNCH of divided synchronizing clock signal D_SYNCH_CLK.

TABLE 2

| Coarse Frequency Search Step | Right Shifter 1830 | Delay Line Register 1730 | A/!S |
| --- | --- | --- | --- |
| 0 | 128 | 256 | 1 |
| 1 | 64 | 384 | 0 |
| 2 | 32 | 320 | 1 |
| 3 | 16 | 352 | 1 |
| 4 | 8 | 368 | 1 |
| 5 | 4 | 376 | 0 |
| 6 | 2 | 372 | 0 |
| 7 | 1 | 370 | 1 |
| 8 | 1 | 371 | 1 |
| 9 | 1 | 372 | 0 |
| 10 | 1 | 371 | 1 |

As explained above initially delay line register 1710 is configured to contain 256 and right shift register 1830 is configured to contain 128. Because the ideal value for delay value DV is 371.5, control signal A/!S is in the Add state (i.e., logic high). At step 1, adder/subtracter 1840 adds 128 to 256; delay line register 1710 stores 384 (i.e., 256+128); and right shifter 1830 right shifts 128, which becomes 64. When delay line register 1710 contains 384 frequency comparator 1850 drives control line A/!S to the subtract logic level (i.e., logic low). Then, in step 2, adder/subtracter 1840 subtracts 64 from 384; delay line register 1710 stores 320 (i.e., 384−64); and right shifter 1830 right shifts 64 which becomes 32. When delay line register 1710 contains 320 frequency comparator 1850 drives control line A/!S to the add logic level (i.e., logic high). This process continues until the value in delay line 37 register 1710 is as close to the optimum value as possible.

Overflow register 1860 receives output bit 9 of adder/subtracter 1840. If output bit 9 is active, an overflow conditions has occurred and must be remedied by an outside control system (not shown). Typically, overflow conditions only occur if clock divider/multiplier 1400 is used with clock frequencies that are too fast or too slow compared to the possible delay time provided by variable delay line 1520.

As stated above, some embodiments of the present invention perform a fine frequency search using delay line fine tuning controller 1720 after initialization circuit 1450 establishes a delay value DV[8:0]. As explained above, variable digital delay lines may not be able to provide the exact delay necessary to generate frequency adjusted clock signal FREQ_CLK at selected frequency F_SEL. The present invention solves this problem by using dual-input edge-triggered SR circuit 1510 (FIG. 15) to synchronize rising clock edges on frequency adjusted clock signal FREQ_CLK to reference clock SYNCH_CLK during a concurrence of frequency adjusted clock signal FREQ_CLK and synchronizing clock signal SYNCH_CLK. As explained above, a concurrence occurs when a rising edge of frequency adjusted clock signal FREQ_CLK is suppose to be aligned with a rising edge synchronizing clock signal SYNCH_CLK, i.e., every Mth rising edge. However, between concurrence the frequency and phase of frequency adjusted clock signal FREQ_CLK may differ from an ideal clock signal at selected frequency F_SEL. Delay line fine tuning controller 1720 selectively adjusts the delay provided by variable delay line 1520 to better match the frequency and phase of the ideal frequency adjusted clock signal.

Figure 19:
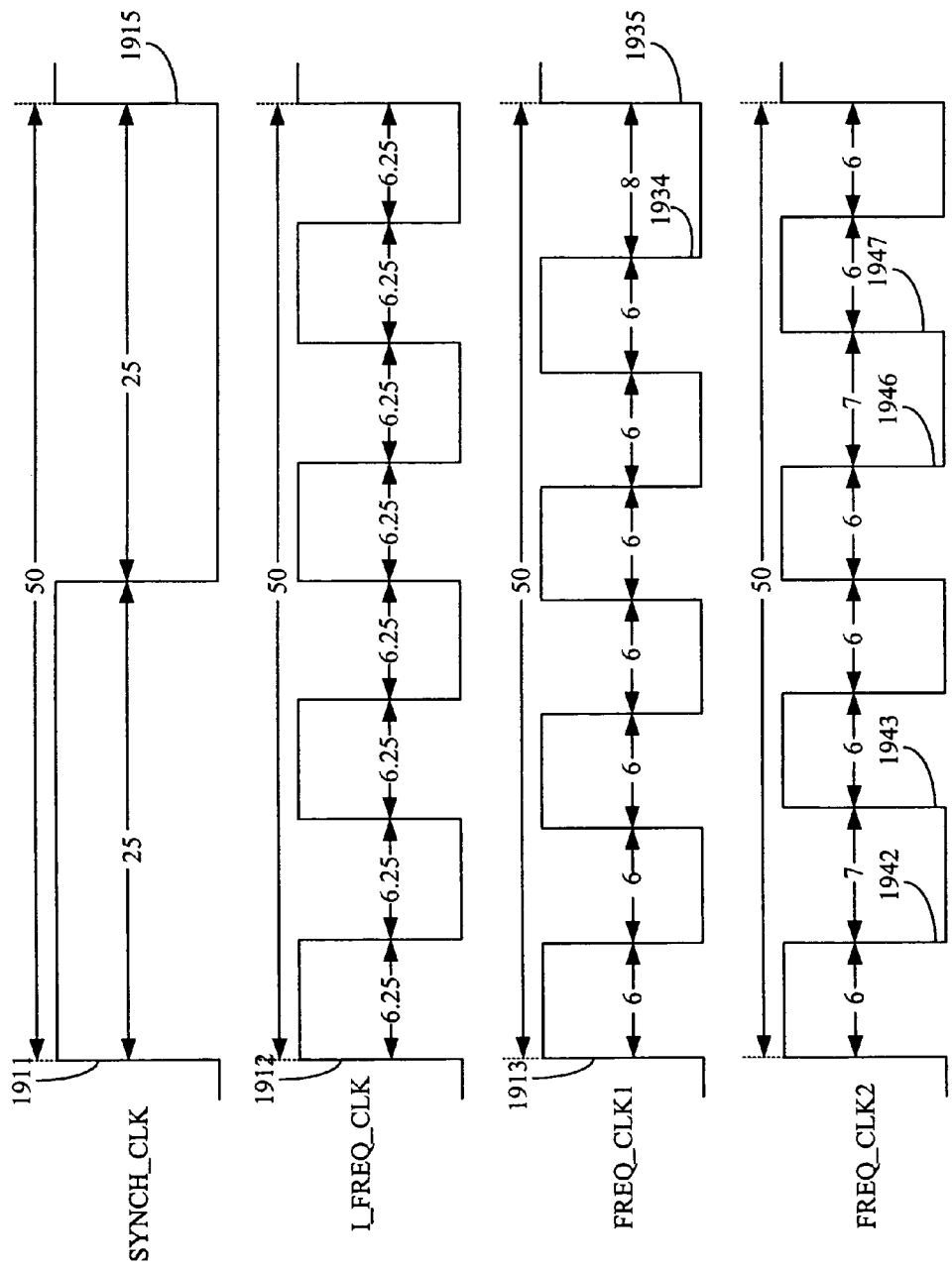
FIG. 19 is a timing diagram for the variable clocking circuit of FIG. 14(a) using a delay line fine tuning controller.

Effectively, delay line fine tuning controller 1720 adds additional precision to variable delay line 1520 by selectively increasing the delay provided by variable delay line 1520 by one base delay BD at various times during a concurrence period. FIG. 19 illustrates the advantages provided by delay line fine tuning controller 1720. Specifically, FIG. 19 shows a synchronizing clock signal SYNCH_CLK, an ideal frequency adjusted clock signal FREQ_CLK, an frequency adjusted clock signal FREQ_CLK1 using a dual-input edge-triggered SR circuit in accordance with one embodiment of the present invention, and an frequency adjusted clock signal FREQ_CLK2 using both a dual-input edge-triggered SR circuit and delay line fine tuning controller 1720 in accordance with another embodiment of the present invention.

In FIG. 19, multiplier M is equal to 4 and divider D is equal to 1. Synchronizing clock signal SYNCH_CLK has a period of 50 nanoseconds. Accordingly, 25 nanoseconds separates each consecutive clock edge in synchronizing clock signal SYNCH_CLK. Ideal frequency adjusted clock signal I_FREQ_CLK has a period of 12.5 nanoseconds. Accordingly, 6.25 nanoseconds separates each consecutive clock edge in ideal frequency adjusted clock signal I_FREQ_ CLK. If the base delay unit of variable delay line 1520 (FIG. 15) is one nanosecond, then variable delay line 1520 is configured to provide 6 nanoseconds of delay between consecutive edges of frequency adjusted clock signal FREQ_ CLK1. However, during a concurrence, the rising edge of frequency adjusted clock signal FREQ_CLK1 is controlled by the rising edge of synchronizing clock signal SYNCH_CLK. Accordingly, rising edge 1935 of frequency adjusted clock signal FREQ_CLK1 is aligned with rising edge 1915 of synchronizing clock signal SYNCH_CLK. Therefore, the time between falling edge 1934 of frequency adjusted clock signal FREQ_CLK1 and rising edge 1935 of frequency adjusted clock signal FREQ_CLK1 is 8 nanoseconds. Thus, the average period during a concurrence cycle of frequency adjusted clock signal FREQ_CLK1 is equal to 12.5 nanoseconds. However, frequency adjusted clock signal FREQ_CLK1 is distorted from ideal frequency adjusted clock signal I_FREQ_CLK because the required extra delay during a concurrence period is bunched at the end of the concurrence period.

Delay line fine tuning controller 1720 selectively increments the delay provided by delay line 1520 to more closely match ideal frequency adjusted clock signal I_FREQ_CLK. Rather than lumping the extra delay required to match the average period of frequency adjusted clock signal FREQ_ CLK2 with ideal frequency adjusted clock signal I_FREQ_ CLK at the of the concurrence period, delay line fine tuning controller 1720 spreads the additional required base delay units over the entire concurrence period. Thus, falling clock edge 1942 and rising clock edge 1943 of frequency adjusted clock signal FREQ_CLK2 are separated by 7 nanoseconds rather than 6 nanoseconds. Similarly, falling clock edge 2046 and rising clock edge 1947 of frequency adjusted clock signal FREQ_CLK2 are separated by 7 nanoseconds rather than 6 nanoseconds. Thus, the waveform of frequency adjusted clock signal FREQ_CLK2 more closely matches ideal frequency adjusted clock signal I_FREQ_CLK than frequency adjusted clock signal FREQ_CLK1.

Figure 20:
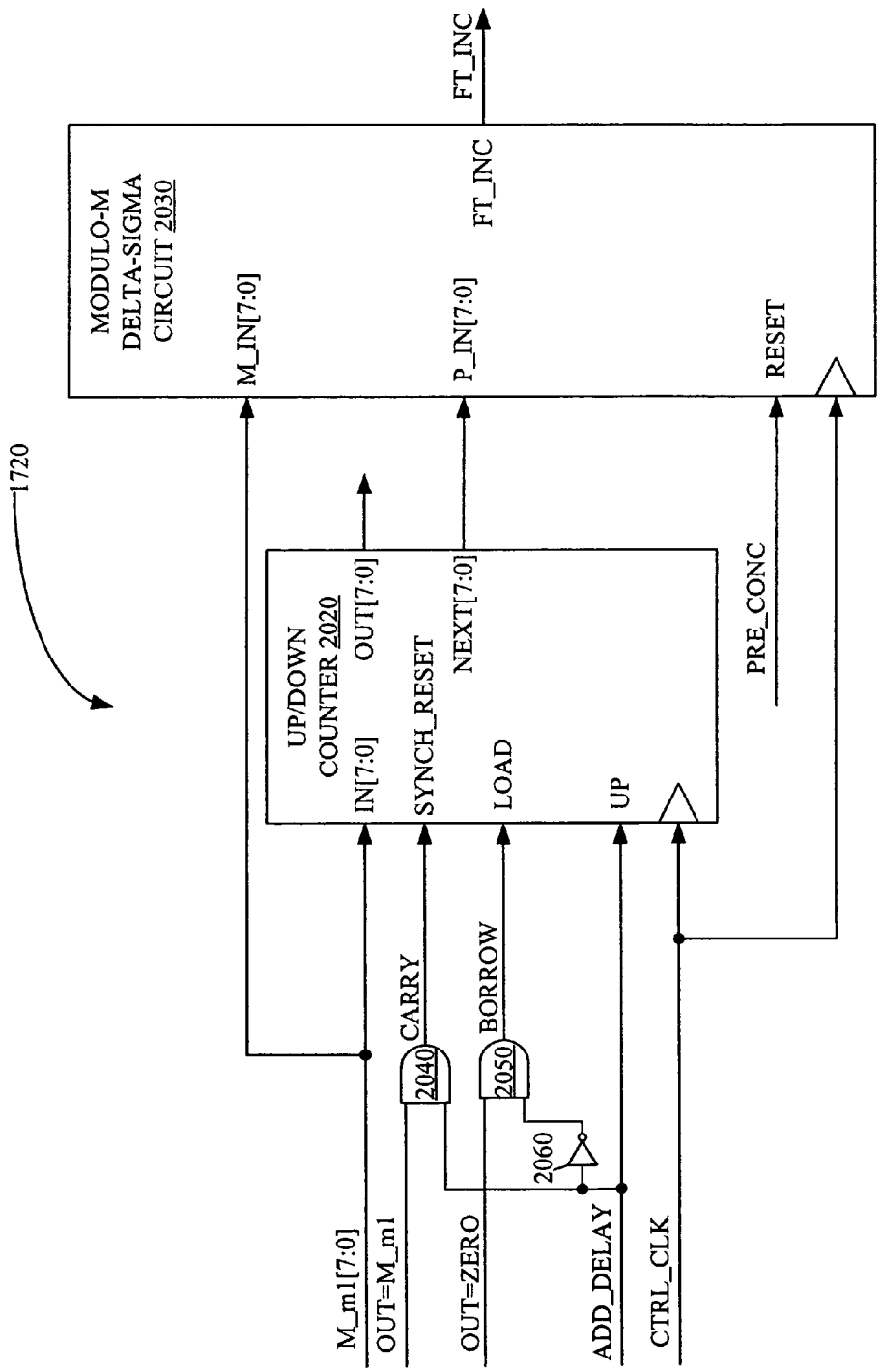
FIG. 20 is a block diagram of a delay line fine tuning controller in accordance with one embodiment of the present invention.

FIG. 20 is a block diagram of a delay line fine tuning controller 1720 in accordance with one embodiment of the present invention. The embodiment of FIG. 20 includes an up/down counter 2020, a modulo-M delta sigma circuit 2030, AND gate 2040, an AND gate 2050, and an inverter 2060. Up/down counter 2020 is configured to count in modulo M. For example, if M is equal to 4, up/down counter 2020 would count up in the sequence 0, 1, 2, 3, 0, 1, etc. and count down in the sequence 3, 2, 1, 0, 3, 2, etc.

Conceptually, up/down counter 2020 is used to provide high precision bits for delay line register 1710. Specifically, the value in up/down counter 2020 indicates the number of additional base delay units needed during a concurrence period to more precisely match frequency F_ADJ of frequency adjusted clock signal FREQ_CLK to selected frequency F_SEL. In the example of FIG. 19, the base delay value is 1 nanoseconds, the delay value in delay line register 1710 is equal to 6 (i.e., one period of frequency adjusted clock signal FREQ_CLK is 12 nanoseconds), the period of concurrence is 50 nanoseconds, and M is equal to 4. Thus, M periods of frequency adjusted clock signal FREQ_CLK is equal to 48 nanoseconds (i.e., 4*12 nanoseconds). However, since the concurrence period is 50 nanoseconds, two more base delay units should be added to frequency adjusted clock signal FREQ_CLK during each concurrence period. Therefore, up/down counter 2020 should contain the value 2. Thus, in general up/down counter 2020 should be equal to the concurrence period minus M times two times the base delay value. However, during actual operation the information to calculate the value for up/down counter 2020 is not generally available. Therefore, searching techniques are used to calculate the value for up/down counter 2020. A searching technique in accordance with one embodiment of the present invention is described below.

Up/down counter 2020 receives the value M−1 (i.e., multiplier M minus 1) on input terminals IN[7:0] via signals M_m1[7:0]. Up/down counter 2020 provides both an output value OUT[7:0] and a next value NEXT[7:0]. Output value OUT[7:0] transitions on rising clock edges of control clock CTRL_CLK. In contrast, next value NEXT [7:0] is equal to the value that OUT[7:0] will become after the next rising clock edge. Add delay signal ADD_DELAY is also provided to control terminal UP. If add delay signal ADD_DELAY is driven to the active logic level (i.e., logic high) up/down counter 2020 counts up. Otherwise, up down/counter 2020 counts down.

To force modulo M counting, up/down counter 2020 includes a synchronous reset terminal coupled to the output terminal of AND gate 2040. AND gate 2040, which receives status signal OUT=M_m1 and add delay control signal ADD_DELAY, generates carry signal CARRY. Status signal OUT=M_m1 is driven to logic high when output value OUT[7:0] is equal to multiplier M minus 1. Status signal OUT=M_m1 is typically generated by a comparator (not shown). Thus, if up/down counter 2020 is counting up and output value OUT[7:0] is equal to multiplier M minus 1, then up/down counter 2020 is reset to zero on the next rising edge of clock signal CTRL_CLK. Carry signal CARRY is also provided to delay line register 1710. An active logic level (e.g., logic high) on carry signal CARRY enables delay line register 1710 to increment.

Up/down counter 2020 also includes a load control terminal LOAD coupled to the output terminal of AND gate 2050. AND gate 2050, which receives status signal OUT=ZERO and add delay control signal ADD_DELAY through inverter 2060, generates borrow signal BORROW. Status signal OUT=ZERO is driven to logic high when output value OUT[7:0] is equal to zero. Status signal OUT=ZERO is typically generated by a comparator (not shown). Thus, if up/down counter 2020 is counting down and output value OUT[7:0] is equal to zero, then up/down counter 2020 is configured to load M minus 1. Borrow signal BORROW is also provided to delay line register 1710. An active logic level (e.g., logic high) on Borrow signal BORROW enables delay line register 1710 to decrement.

Next signal NEXT[7:0] is coupled to pulse input terminals P_IN[7:0] of modulo-M delta-sigma circuit 2030. Modulo-M delta sigma circuit 2030 also receives value M−1 (i.e., multiplier M minus 1) on modulo input terminals M_IN[7:0] via signals M_m1[7:0], a pre-concurrence signal PRE_CONC, and control clock signal CTRL_CLK. Modulo-M delta-sigma circuit 2030, drives fine tuning increment control signal FT_INC. For clarity, modulo-M delta sigma circuit 2030 is said to receive a modulo value M (although in the embodiment of FIG. 20, M minus 1 is actually received) and a pulse count P. Pre-concurrence signal PRE_CONC, which is provided to reset terminal RESET of modulo-M delta sigma circuit 2030, is driven to the active logic level (e.g., logic high) the clock cycle prior to a concurrence. During M periods fine tuning increment control signal FT_INC should contain P active pulses. The active pulses on fine tuning increment control signal FT_INC should be spread out across the M Periods. Table 3 provides some samples of fine tuning increment control signal FT_INC, where a "1" represents an active pulse and "0", represents in inactive pulse.

TABLE 3

| M | P | FT_INC |
|---|---|---|
| 4 | 2 | 1010 |
| 6 | 2 | 100100 |
| 6 | 3 | 101010 |
| 6 | 5 | 111110 |
| 7 | 3 | 1010100 |
| 7 | 4 | 1101010 |
| 9 | 4 | 101010100 |
| 12 | 5 | 101010010100 |
| 15 | 3 | 100001000010000 |

Concurrence

Figure 21:
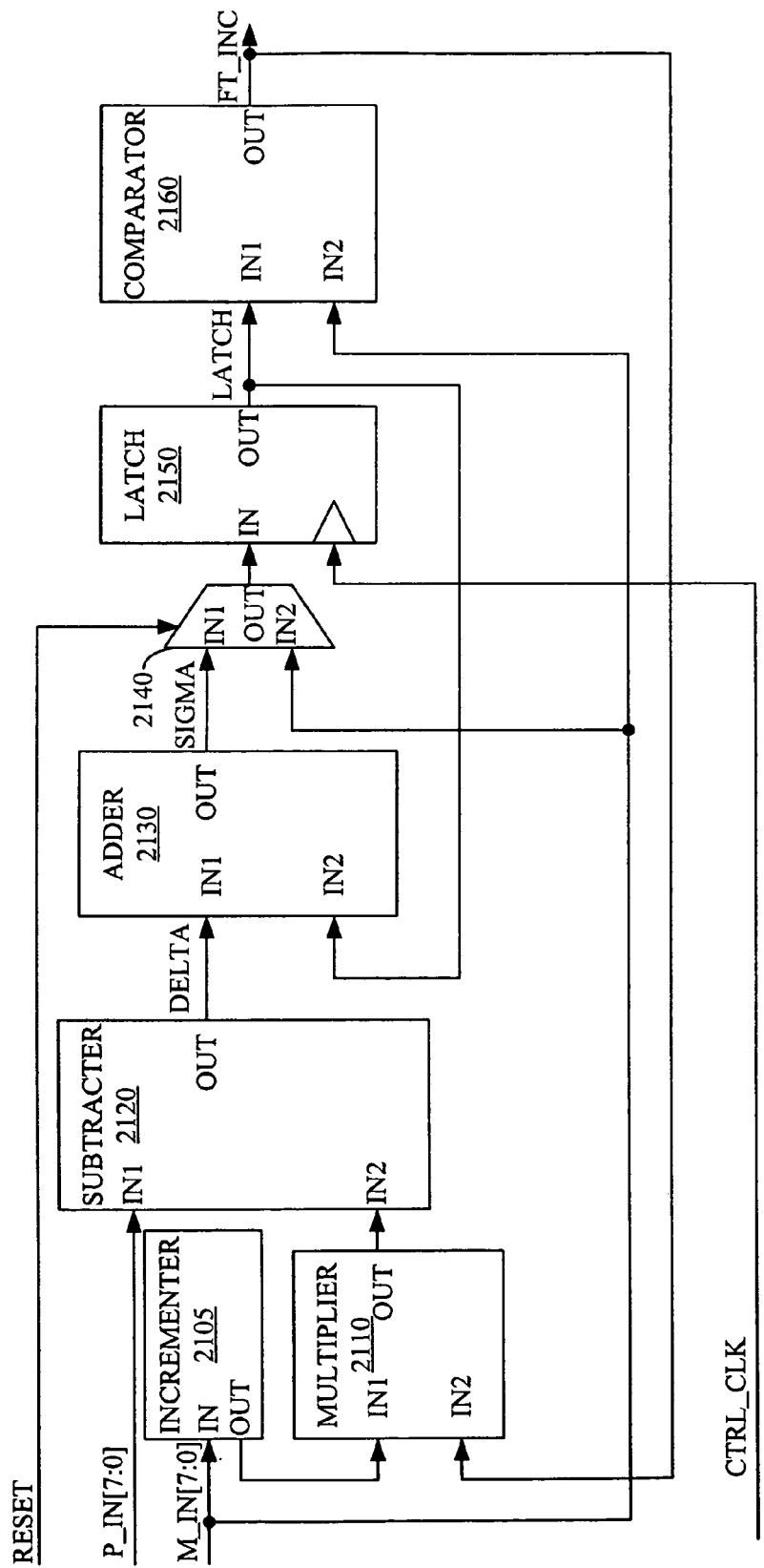
FIG. 21 is a block diagram of a modulo-M delta sigma circuit in accordance with one embodiment of the present invention.

FIG. 21 is a block diagram of modulo-M delta sigma circuit 2030 in accordance with one embodiment of the present invention. The embodiment of FIG. 21 includes an incrementer 2105, a multiplier 2110, a subtracter 2120, an adder 2130, a multiplexing circuit 2140, a latch 2150, and a comparator 2160. Modulo input terminals M_IN[7:0] are coupled to an input port IN of incrementer 2105, a second input port 1N2 of multiplexing circuit 2140, and a second input port 1N2 of comparator 2160. Because the specific embodiment of FIG. 21 is designed to receive modulo value M minus 1 rather than modulo value M on modulo input terminals M_IN[7:0], incrementer 2105 increments the value provided on modulo input terminals M_IN[7:0] by one to generate modulo value M, which is provided to a first input port of multiplier 2110. Other embodiments of the present invention may receive modulo value M on modulo input terminals M_IN[7:0]. These embodiments would not require incrementer 2105. A second input port 1N2 of multiplier 2110 is coupled to an output terminal of comparator 2160. Multiplier 2110 multiples the value provided on modulo input terminals M_IN[7:0] by the output value of comparator 2160 to generate an output product, which is provided to a second input port IN2 of subtracter 2120. In many embodiments of the present invention, multiplier 2110 is implemented using a plurality of AND gates, because the output value of comparator 2160 is a single bit.

Pulse input terminals P_IN[7:0] are coupled to a first input terminal of subtracter 2120. Subtracter 2120 is configured to subtract the output value from multiplier 2110 from the pulse value provided on pulse input terminals P_IN[7:0] to generate a delta value DELTA on output port OUT of subtracter 2120. Output port OUT of subtracter 2120 is coupled to a first input port IN1 of adder 2130. A second input port IN2 of adder 2130 is coupled to an output port OUT of latch 2150. Adder 2130 is configured to add delta value DELTA provided by subtracter 2120 to a latch value LATCH provided by latch 2150 to generate a sigma value SIGMA on output port OUT of adder 2130. Output port OUT of adder 2130 is coupled to a first input port IN1 of multiplexing circuit 2140. Some embodiments of the present invention calculate sigma value SIGMA using a sigma calculation circuit, such as a three input adder, which can perform the calculation faster than using a separate delta calculation circuit, such as subtracter 2120. In these embodiments the sigma calculation circuit replaces subtracter 2120 and adder 2130. For embodiments using a three input adder, the output value of multiplier 2110 can be converted into a 2's complement format prior to the three input adder. Furthermore, incrementer 2105 and multiplier 2110 may be combined within a circuit to compute the 2's complement format.

Multiplexing circuit 2140 is configured to drive either sigma value SIGMA or the value provided on modulo input terminals M_IN[7:0] to input port IN of latch 2150 through output port OUT of multiplexing circuit 2140. Reset terminal RESET is coupled to a control terminal of multiplexing circuit 2140. Pre-concurrence signal PRE_CONC, which is coupled to reset terminal RESET in FIG. 20, determines the output value of multiplexing circuit 2140. Specifically, during the clock cycle before concurrences 6 multiplexing circuit 2140 is configured to drive the value provided on modulo input terminals M_IN[7:0] to input port IN of latch 2150. Otherwise, multiplexing circuit 2140 is configured to drive sigma value SIGMA to input port IN of latch 2150. Latch 2150, which is clocked by control clock signal CTRL_CLK, provides a LATCH value on output port OUT of latch 2150 to a first input port IN1 of comparator 2160. Comparator 2160, which is configured to compare latch value LATCH with the value provided on modulo input terminals r M_IN[7:0], generates fine tuning increment signal FT_INC on output terminal OUT of comparator 2160. Specifically, if latch value LATCH is greater than the modulo value provided on modulo input terminals M_IN[7:01], fine tuning increment signal FT_INC is driven to the active logic level (e.g., logic high). Otherwise, fine tuning increment signal FT_INC is driven to the inactive logic level (e.g., logic low).

Table 4 provides a pseudo code implementation of a second embodiment of modulo-M delta sigma circuit 2030. One skilled in the art of digital design can convert the pseudo code of Table 4 to a hardware definition language such as Verilog to implement the circuit.

TABLE 4

DELTA = P – (FT_INC * M)
SIGMA = DELTA + LATCH
IF RESET then LATCH=(M–1)
　　else LATCH=SIGMA
IF LATCH > (M–1) then FT_INC = 1
　　else FT_INC = 0

As explained above, one embodiment of the present invention operates digital frequency synthesizer 1400 in three distinct phases. Specifically, digital frequency synthesizer 1400 is operated in a coarse frequency search phase, a fine frequency search phase, and a clock maintenance phase. During the coarse frequency search phase, variable delay line 1520 (FIG. 15) is configured using the fast binary search as described above. Delay line fine tuning controller 1720 (FIG. 17) is disabled during the coarse frequency search phase. The coarse frequency search phase ends when right shifter 1830 (FIG. 18) contains a value of one.

During the fine frequency search phase, delay line fine tuning controller 1720 is activated and clock selector 1430 (FIG. 14) is configured to select frequency adjusted clock signal FREQ_CLK as the control clock signal CTRL_CLK. During the fine frequency search phase, delay line fine tuning controller 1720 is controlled by frequency comparator 1850 (FIG. 18) using control signal A/!S as described above. Specifically, control signal A/!S determines whether up/down counter 2020 increments or decrements. Halt/restart circuit 1445 is also used in the fine frequency search phase during each concurrence period. In the fine frequency search phase, up/down counter 2020 increments or decrements by one each concurrence period. As explained above, up/down counter 2020 is linked to delay line register 1710 by carry signal CARRY and borrow signal BORROW. Thus, the value in delay line register 1710 may change during the fine frequency search phase. The fine frequency search phase ends when frequency comparator 1850 detects a reversal and drives frequency comparator reversal signal to the active state.

During the clock maintenance phase, phase comparator 1440 (FIG. 14) takes control of oscillator control circuit 1460 from initialization circuit 1450. During the maintenance phase, delay line fine tuning controller 1720 is selectively enabled. Specifically, in one embodiment of the present invention, the maintenance phase cycles through three sub-phases. Each sub-phase lasts for one concurrence period. In the first sub-phase, phase comparator 1440 is initialized. During the first sub-phase the value of up/down counter 2020 does not change. In the second sub-phase phase comparator 1440 determines whether feedback clock signal FBK_CLK leads or lags divided synchronizing clock signal D_SYNCH_CLK. In the third sub-phase delay line fine tuning controller 1720 is enabled. Thus, up/down counter 2020 can increment or decrement by one as controlled by phase comparator control signal PC_CTRL. As explained above phase comparator control signal PC_CTRL indicates whether feedback clock signal FBK_CLK leads or lags divided synchronizing clock signal D_SYNCH_CLK. If delayed synchronizing clock signal D_SYNCH_CLK leads feedback clock signal FBK_CLK, then phase comparator 1440 causes up/down counter 2020 to decrement during the second sub-phase. Otherwise, phase comparator 1440 causes up/down counter 2020 to increment during the second sub-phase. In other embodiments, the maintenance phase may include more or fewer sub-phases. For example, in one embodiment, the first sub-phase and the second sub-phase described above are combined into a single sub-phase. Some embodiments of the present invention wait until phase comparator 1440 detects multiple reversals (such as four reversals) before declaring frequency adjusted clock signal FREQ_CLK is at selected frequency F_SEL.

In the various embodiments of the present invention, novel structures have been described for digital clock managers. By using a synchronizing clock signal with matched output delays, the present invention can provide deskewed output clock signals with synchronized frequency adjusted clock signals. The various embodiments of the structures and methods of this invention that are described above are illustrative only of the principles of this invention and are not intended to limit the scope of the invention to the particular embodiments described. For example, in view of this disclosure those skilled in the art can define other delay lock loops, output generation circuits, output delays, variable delay circuits, digital frequency synthesizers, clock phase shifters, delay lines, output generators, controllers, phase detectors, latches, registers, clock dividers, phase comparators, frequency comparators, up/down counters, initialization circuits, delta-sigma circuits, latches, halt/restart circuits, delay lines, variable digital oscillators, edge-triggered SR circuits, active edges, enable logic levels, and so forth, and use these alternative features to create a method, circuit, or system according to the principles of this invention. Thus, the invention is limited only by the following claims.

What is claimed is:

1. A digital clock manager having a reference input terminal, a skew input terminal, an output terminal, and a frequency adjusted output terminal, the digital clock manager comprising:
　a delay lock loop (DLL) coupled to the reference input terminal, the skew input terminal, and the output terminal, wherein the delay lock loop generates an output clock signal at the output terminal;
　wherein the delay lock loop comprises a DLL output circuit having a DLL output delay; and
　a digital frequency synthesizer (DFS), having a variable oscillator, coupled to receive a clock signal generated by the delay lock loop and the frequency adjusted output terminal, wherein the digital frequency synthesizer generates a frequency adjusted clock signal at the frequency adjusted output terminal and wherein the frequency adjusted clock signal is synchronized with the output clock signal during concurrences.

2. The digital clock manager of claim 1, wherein the delay lock loop synchronizes a reference clock signal on the reference input terminal with a skewed clock signal on the skew input terminal.

3. The digital clock manager of claim 1, wherein the digital frequency synthesizer comprises a DFS output circuit having a DFS output delay.

4. The digital clock manager of claim 1, further comprising a variable delay circuit coupled between the delay lock loop and the output terminal.

5. The digital clock manager of claim 1, further comprising a variable delay circuit coupled between the digital frequency synthesizer and the frequency adjusted output terminal.

6. The digital clock manager of claim 1, wherein the digital frequency synthesizer performs a frequency search while the delay lock loop is performing lock acquisition.

7. The digital clock manager of claim 3, wherein the DLL output delay is substantially equal to the DFS output delay.

8. The digital clock manager of claim 3, wherein the DLL output circuit comprises a plurality of components and the DFS output circuit comprises the same plurality of components.

9. A digital clock manager having a reference input terminal, a skew input terminal, an output terminal, and a frequency adjusted output terminal, the digital clock manager comprising:
   a delay lock loop (DLL) coupled to the reference input terminal, the skew input terminal, and the output terminal, wherein the delay lock loop generates an output clock signal at the output terminal;
   wherein the delay lock loop comprises a DLL output circuit having a DLL output delay; and
   a digital frequency synthesizer (DFS), having a variable oscillator, coupled to the delay lock loop and the frequency adjusted output terminal, wherein the digital frequency synthesizer generates a frequency adjusted clock signal at the frequency adjusted output terminal and wherein the frequency adjusted clock signal is synchronized with the output clock signal during concurrences.

10. A digital clock manager having a reference input terminal, a skew input terminal, an output terminal, and a frequency adjusted output terminal, the digital clock manager comprising:
   a delay lock loop (DLL) coupled to the reference input terminal, the skew input terminal, and the output terminal, wherein the delay lock loop generates an output clock signal at the output terminal;
   wherein the delay lock loop comprises a DLL output circuit having a DLL output delay;
   a multiplexer having a first input terminal coupled to the reference input terminal, a second input terminal coupled to the delay lock loop, and an output terminal; and
   a digital frequency synthesizer (DFS), having a variable oscillator, coupled to the output terminal of the multiplexer and the frequency adjusted output terminal, wherein the digital frequency synthesizer generates a frequency adjusted clock signal at the frequency adjusted output terminal.

11. The digital clock manager of claim 10, wherein the delay lock loop is configured to provide a synchronizing clock signal to the second input terminal of the multiplexer.

12. The digital clock manager of claim 11, wherein the digital frequency synthesizer is configured to perform a frequency search phase using a reference clock signal provided to the reference input terminal.

13. The digital clock manager of claim 12, wherein the digital frequency synthesizer is configured to provide a frequency adjusted clock signal based on the synchronizing clock signal.

14. A digital clock manager having a reference input terminal, a skew input terminal, an output terminal, and a frequency adjusted output terminal, the digital clock manager comprising:
   a delay lock loop (DLL) coupled to the reference input terminal, the skew input terminal, and the output terminal, wherein the delay lock loop generates an output clock signal at the output terminal;
   a digital frequency synthesizer (DFS), having a variable oscillator, coupled to the delay lock loop and the frequency adjusted output terminal, wherein the digital frequency synthesizer generates a frequency adjusted clock signal at the frequency adjusted output terminal; and
   wherein the delay lock loop drives a synchronizing clock signal to the digital frequency synthesizer and wherein the frequency adjusted clock signal is synchronized with the output clock signal during concurrences.

15. The digital clock manager of claim 14, wherein the delay lock loop is configured to generate an output clock signal on the output terminal, wherein the output clock signal lags the synchronizing clock signal by a DLL output delay.

16. The digital clock manager of claim 15, wherein an active edge of the frequency adjusted clock signal lags an active edge of the synchronizing clock signal by a DFS output delay during a concurrence period.

17. The digital clock manager of claim 16, wherein the DLL output delay is substantially equal to the DFS output delay.

* * * * *